United States Patent
Lee et al.

(10) Patent No.: US 9,299,392 B2
(45) Date of Patent: Mar. 29, 2016

(54) SEMICONDUCTOR MEMORY DEVICES

(71) Applicants: Jaekyu Lee, Yongin-si (KR); Changkyu Kim, Suwon-si (KR)

(72) Inventors: Jaekyu Lee, Yongin-si (KR); Changkyu Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 181 days.

(21) Appl. No.: 14/055,061

(22) Filed: Oct. 16, 2013

(65) Prior Publication Data

US 2014/0126265 A1 May 8, 2014

(30) Foreign Application Priority Data

Nov. 6, 2012 (KR) .................. 10-2012-0124946

(51) Int. Cl.

| | |
|---|---|
| G11C 5/06 | (2006.01) |
| H01L 27/105 | (2006.01) |
| G11C 13/00 | (2006.01) |
| H01L 27/02 | (2006.01) |
| H01L 27/22 | (2006.01) |
| H01L 43/08 | (2006.01) |
| H01L 45/00 | (2006.01) |
| H01L 27/24 | (2006.01) |
| G11C 7/18 | (2006.01) |

(52) U.S. Cl.
CPC .............. *G11C 5/063* (2013.01); *G11C 13/0002* (2013.01); *H01L 27/0207* (2013.01); *H01L 27/228* (2013.01); *H01L 27/2436* (2013.01); *H01L 43/08* (2013.01); *H01L 45/04* (2013.01); *H01L 45/06* (2013.01); *H01L 45/1233* (2013.01); *H01L 45/143* (2013.01); *H01L 45/144* (2013.01); *H01L 45/146* (2013.01); *H01L 45/147* (2013.01); *G11C 7/18* (2013.01); *G11C 2213/82* (2013.01)

(58) Field of Classification Search
CPC ............ G11C 5/02; G11C 5/063; G11C 7/18; H01L 23/52; H01L 27/105; H01L 27/1052; H01L 27/0617; H01L 27/228; H01L 27/2436; H01L 27/2454
See application file for complete search history.

(56) References Cited

U.S. PATENT DOCUMENTS

| | | | |
|---|---|---|---|
| 6,611,455 B2 | 8/2003 | Sekiguchi et al. | |
| 7,002,827 B1 * | 2/2006 | Sabharwal et al. | ............. 365/94 |
| 7,436,699 B2 * | 10/2008 | Tanizaki et al. | ............... 365/158 |
| 7,480,180 B2 * | 1/2009 | Umezawa | ................ 365/185.18 |
| 7,542,326 B2 * | 6/2009 | Yoshimura et al. | ........... 365/148 |

(Continued)

FOREIGN PATENT DOCUMENTS

| | | |
|---|---|---|
| JP | 2012-094929 A | 5/2012 |
| KR | 10-1095080 B1 | 12/2011 |

*Primary Examiner* — Allison P Bernstein
(74) *Attorney, Agent, or Firm* — Harness, Dickey & Pierce

(57) ABSTRACT

Semiconductor memory devices include unit cells two-dimensionally arranged along rows and columns in one cell array block. The unit cells are classified into a plurality of cell subgroups, and each of the cell subgroups includes the unit cells constituting a plurality of the rows. Each of the unit cells includes a selection element and a data storage part. A word line is connected to gate electrodes of selection elements of the unit cells constituting each column. Bit lines are connected to data storage parts of the unit cells constituting the rows. A source line, parallel to the bit line, is electrically connected to source terminals of the selection elements of the unit cells in each cell subgroup. The source line is parallel to the bit line. A distance between the source line and the select bit line is equal to a distance between the bit lines adjacent to each other.

28 Claims, 21 Drawing Sheets

(56) References Cited

U.S. PATENT DOCUMENTS

| | | | |
|---|---|---|---|
| 7,852,662 B2 | 12/2010 | Yang et al. | |
| 7,859,886 B2 * | 12/2010 | Kinoshita | 365/148 |
| 7,995,378 B2 | 8/2011 | Yoon et al. | |
| 8,004,872 B2 | 8/2011 | Jung et al. | |
| 8,036,026 B2 | 10/2011 | Rho et al. | |
| 8,144,509 B2 | 3/2012 | Jung et al. | |
| 8,248,837 B2 * | 8/2012 | Kinoshita | 365/148 |
| 8,427,864 B2 * | 4/2013 | Kawahara et al. | 365/158 |
| 8,629,494 B2 * | 1/2014 | Kim et al. | 257/334 |
| 8,976,580 B2 * | 3/2015 | Lee et al. | 365/163 |
| 2002/0154540 A1 | 10/2002 | Sekiguchi et al. | |
| 2007/0296007 A1 | 12/2007 | Park et al. | |
| 2008/0266943 A1 | 10/2008 | Yang et al. | |
| 2009/0161413 A1 | 6/2009 | Yoon et al. | |
| 2009/0323404 A1 | 12/2009 | Jung et al. | |
| 2010/0124095 A1 | 5/2010 | Jung et al. | |
| 2010/0290279 A1 | 11/2010 | Rho et al. | |
| 2011/0133270 A1 * | 6/2011 | Juengling | 257/331 |
| 2011/0222334 A1 | 9/2011 | Aoki | |
| 2011/0267874 A1 | 11/2011 | Ryu et al. | |
| 2012/0069639 A1 | 3/2012 | Hoya et al. | |
| 2013/0040408 A1 * | 2/2013 | Nam et al. | 438/3 |
| 2015/0069558 A1 * | 3/2015 | Nakayama et al. | 257/421 |

\* cited by examiner

SEMICONDUCTOR MEMORY DEVICES

CROSS-REFERENCE TO RELATED APPLICATIONS

This U.S. non-provisional patent application claims the benefit of priority under 35 U.S.C. §119 to Korean Patent Application No. 10-2012-0124946, filed on Nov. 6, 2012 in the Korean Intellectual Property Office, the entire contents of which are herein incorporated by reference.

BACKGROUND

1. Field

Example embodiments of the inventive concept relate to semiconductor devices and, more particularly, to semiconductor memory devices including a source line.

2. Description of Related Art

Semiconductor devices are attractive in an electronic industry because of their small size, multi-function, and/or low manufacture costs. Semiconductor devices may be categorized as any one of semiconductor memory devices storing logic data, semiconductor logic devices processing operations of logical data, and system on chips (SOC) including both the functions of the semiconductor memory devices and the function of the semiconductor logic devices.

Semiconductor memory devices may read data stored in memory cells or may write data in memory cells by using differences between voltages applied to various terminals (e.g., a bit line, a word line, and/or a source). If the voltages are badly controlled, power consumption of semiconductor memory devices may increase. High integration and low power consumption of semiconductor memory devices have been increasingly demanded with the development of the electronic industry. Various researches have been conducted for satisfying the above demands.

SUMMARY

Example embodiments relate to semiconductor devices and, more particularly, to semiconductor memory devices including a source line.

Example embodiments of the inventive concept may provide semiconductor memory devices capable of reducing their power consumption.

Example embodiments of the inventive concept may also provide highly integrated semiconductor memory devices.

In example embodiments, there is provided a semiconductor memory device including unit cells two-dimensionally arranged along rows and columns in one cell array block, the unit cells classified into a plurality of cell subgroups, and each of the cell subgroups including the unit cells constituting a plurality of the rows, and each of the unit cells including a selection element and a data storage part; a word line connected to gate electrodes of the selection elements of the unit cells constituting each of the columns; bit lines connected to the data storage parts of the unit cells constituting the rows, the bit lines crossing the word line; and a source line in each of the cell subgroups, the source line being electrically connected to source terminals of the selection elements of the unit cells included in each of the cell subgroups, and the source line being adjacent to a select bit line of the bit lines. The source line is parallel to the bit line; and a distance between the source line and the select bit line is equal to a distance between the bit lines adjacent to each other.

In example embodiments, the source lines respectively included in the cell subgroups may be controlled independently from each other. For example, the semiconductor memory device may be configured to apply a reference voltage to the source line of a selected cell subgroup of the plurality of cell subgroups in an operation selected from a program operation and a sensing operation, wherein the semiconductor memory device may be configured to apply a voltage different from the reference voltage to, or to float, the source lines of unselected cell subgroups of the plurality of cell subgroups in the operation.

In example embodiments, the semiconductor memory device may further include local interconnection lines in each of the cell subgroups, the local interconnection lines extending parallel to each other in a longitudinal direction of the word line. Each of the local interconnection lines may be connected to the source terminals of the unit cells arranged in a longitudinal direction of the word line, and the source line may cross and be connected to the local interconnection lines in each of the cell subgroups. The local interconnection lines in one of the cell subgroups may be separated from the local interconnection lines in the others of the cell subgroups.

In example embodiments, the unit cells constituting each of the columns may be classified into a plurality of sub-columns that are included in the plurality of cell subgroups, respectively. The sub-columns are arranged in pairs, and the unit cells in each of the pairs of the sub-columns share one of the local interconnection lines in each of the cell subgroups and may be symmetric with respect to the shared local interconnection line.

In example embodiments, the semiconductor memory device may further include a dummy row in each of the cell subgroups. The dummy row may include a plurality of dummy cells arranged in a direction parallel to the rows. Data storage parts of the dummy cells in the dummy row may be connected to the source line. In this case, the dummy row may be adjacent to a select row from among the rows, and a distance between the dummy row and the select row may be equal to a distance between the rows adjacent to each other.

In example embodiments, the number of the bit lines included in each of the cell subgroups may be at least four. In example embodiments, the number of the bit lines at a side of the source line may be equal to the number of the bit lines at another side of the source line in each of the cell subgroups.

In other example embodiments, there is provided a semiconductor memory device including a substrate having active portions two-dimensionally arranged along rows and columns in one cell array block, the active portions being classified into a plurality of cell subgroups, and each of the cell subgroups including the active portions constituting a plurality of the rows, a pair of cell gate electrodes crossing the active portions constituting each of the columns, the pair of cell gate electrodes being insulated from the active portions, a first doped region in each of the active portions between the pair of cell gate electrodes, a pair of second doped regions each respectively in both edge portions of each of the active portions, the pair of cell gate electrodes being between the pair of second doped regions in a plan view, data storage parts each respectively electrically connected to the pair of second doped regions, and a conductive line on the data storage parts electrically connected to the second doped regions of the active portions in each of the rows, the conductive line extending in parallel to each of the rows. The conductive lines in each of the cell subgroups may include a source line and a plurality of bit lines, and the source line may be electrically connected to the first doped regions in each of the cell subgroups.

In example embodiments, the source lines respectively included in the plurality of cell subgroups may be controlled independently from each other.

In example embodiments, the rows may be arranged at equal intervals with respect to each other, the conductive lines may also be arranged at equal intervals with respect to each other, and the conductive lines may be at the same level from a top surface of the substrate.

In example embodiments, the semiconductor memory device may further include local interconnection lines on the substrate in each of the cell subgroups. Each of the local interconnection lines may be connected to the first doped regions in the active portions of each column within each cell subgroup; the source line may cross over the local interconnection lines and may be electrically connected to the local interconnection lines in each of the cell subgroups; and the local interconnection lines in one of the cell subgroups may be separated from the local interconnection lines in the others of the cell subgroups.

In example embodiments, the semiconductor memory device further include a source plug between the source line and each of the local interconnection lines.

In example embodiments, a width of a bottom surface of the source plug may be smaller than a width of each of the local interconnection lines in a longitudinal direction of the source line.

In example embodiments, a width of a bottom surface of the source plug may be greater than a width of each of the local interconnection lines in a longitudinal direction of the source line.

In example embodiments, the number of the bit lines in each of the cell subgroups may be at least four.

In example embodiments, the active portions under the bit line may be cell active portions; and a pair of unit cells may consist of the pair of cell gate electrodes and the first and second doped regions formed in each of the cell active portions and the data storage parts connected thereto. The active portions under the source line may be dummy active portions; and a pair of dummy cells may consist of the pair of cell gate electrodes and the first and second doped regions formed in each of the dummy active portions and the data storage parts connected thereto.

In example embodiments, the pair of cell gate electrodes may be in cell grooves each respectively crossing the active portions of each of the columns.

In example embodiments, the semiconductor memory device may further include device isolation patterns in or on the substrate in the one cell array block to define active line patterns extending parallel to each other in one direction; and isolation gate electrodes in isolation grooves crossing the active line patterns and the device isolation patterns parallel to each other, respectively. The isolation gate electrodes may be insulated from the active line patterns. The isolation gate electrodes may divide each of the active line patterns into the active portions constituting each of the rows.

In further example embodiments, there is provided a semiconductor memory device including a substrate including a plurality of unit cells two-dimensionally arranged along rows extending in a first direction and columns extending in a second direction in one cell array block, the unit cells being classified into a plurality of cell subgroups, each of the cell subgroups including the unit cells constituting a plurality of the rows, and the unit cells including a plurality of gate electrodes and doped regions alternately arranged in the substrate along the first direction in each of the rows, a plurality of data storage parts each respectively connected to a plurality of first-type doped regions from among the doped regions, and a plurality of conductive lines extending in the first direction and each electrically connected to the first-type doped regions via the data storage parts, the second direction intersecting the first direction. In each of the cell subgroups, a first conductive line from among the conductive lines is electrically connected to second-type doped regions from among the doped regions.

In example embodiments, the semiconductor memory device may be configured to independently control the first conductive lines respectively included in the cell subgroups.

In example embodiments, in each of the cell subgroups, a plurality of second conductive lines from among the conductive lines may be configured to be electrically isolated from the second-type doped regions.

In example embodiments, the plurality of unit cells may include at least two transistors. Each of the at least two transistors may consist of one of the gate electrodes, one of the first-type doped regions, and one of the second-type doped regions. The at least two transistors may share the one of the second-type doped regions.

In example embodiments, the at least two transistors constituting each of the columns may be selection elements of the unit cells.

In example embodiments, the unit cells may be a plurality of memory cells having a resistance changeable from a first resistance state to a second resistance state.

In example embodiments, the semiconductor memory device may further include single local interconnection line, in each of the cell subgroups, via which the first conductive line is electrically connected to the second-type doped regions. The local interconnection line in one of the cell subgroups may be electrically isolated from the local interconnection lines in the cell subgroups adjacent to the one of the cell subgroups.

In example embodiments, the unit cells constituting a plurality of the rows in each of the cell subgroups may share the first conductive line.

In example embodiments, the semiconductor memory device may further include a plurality of gate insulating layers each respectively insulating one of the gate electrodes from the doped regions. The gate insulating layers may be conformally formed on the respective gate electrodes, the rows may be arranged at equal intervals with respect to each other, the conductive lines may be arranged at equal intervals with respect to each other, and the conductive lines may be at the same level from a top surface of the substrate

BRIEF DESCRIPTION OF THE DRAWINGS

Example embodiments will be more clearly understood from the following detailed description taken in conjunction with the accompanying drawings. FIGS. 1-11 represent non-limiting, example embodiments as described herein.

FIG. 1 is a schematic block diagram illustrating a semiconductor memory device according to example embodiments of the inventive concept;

FIG. 2 is a circuit diagram illustrating a cell array in a cell array block of a semiconductor memory device according to example embodiments of the inventive concept;

FIG. 4 is a plan view illustrating a modified example of a semiconductor memory device according to example embodiments of the inventive concept;

FIGS. 7A to 9A are plan views illustrating a method of manufacturing a semiconductor memory device according to example embodiments of the inventive concept;

FIGS. 7B to 9B are cross-sectional views taken along lines I-I' and II-II' of FIGS. 7A to 9A, respectively;

FIGS. 7C to 9C are cross-sectional views taken along lines III-III' of FIGS. 7A to 9A, respectively;

FIG. 10 is schematic block diagram illustrating an example of electronic systems including semiconductor memory devices according to example embodiments of the inventive concept; and FIG. 11 is schematic block diagram illustrating an example of memory cards including semiconductor memory devices according to example embodiments of the inventive concept.

DETAILED DESCRIPTION OF EXAMPLE EMBODIMENTS

Figure 1:
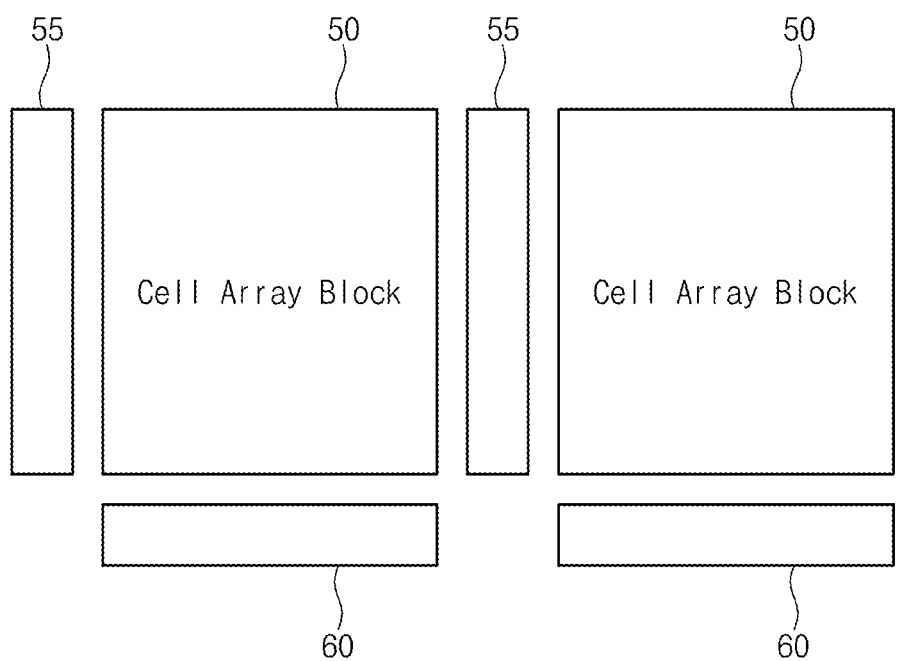

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to semiconductor devices and, more particularly, to semiconductor memory devices including a source line.

FIG. 1 is a schematic block diagram illustrating a semiconductor memory device according to example embodiments of the inventive concept.

Referring to FIG. 1, a semiconductor memory device according to embodiments of the inventive concept may include a plurality of cell array blocks 50 and a peripheral circuit region. Each of the cell array blocks 50 may include a plurality of cells arranged along rows and columns. The peripheral circuit region may include first decoder parts 55 and second decoder parts 60. In an example embodiment, each of the first decoder parts 55 may be connected to word lines which are connected to the cells in each of the cell array blocks 50, and each of the second decoder parts 60 may be connected to bit lines which are connected to the cells in each of the cell array blocks 50. Each of the first decoder parts 55 may select any one of the word lines in each of the cell array blocks 50, and each of the second decoder parts 60 may select any one of the bit lines in each of the cell array blocks 50. In an example embodiment, a single first decoder part 55 may be disposed between the cell array blocks 50 adjacent to each other. In other words, the adjacent cell array blocks 50 may be spaced apart from each other by a set distance (e.g., at least a width of the first decoder part 55). In other example embodiments, the adjacent cell array blocks 50 may share the first decoder part 55 therebetween.

The cells, the word lines, and the bit lines included in each of the cell array blocks 50 will be described in more detail with reference to FIG. 2.

Figure 2:
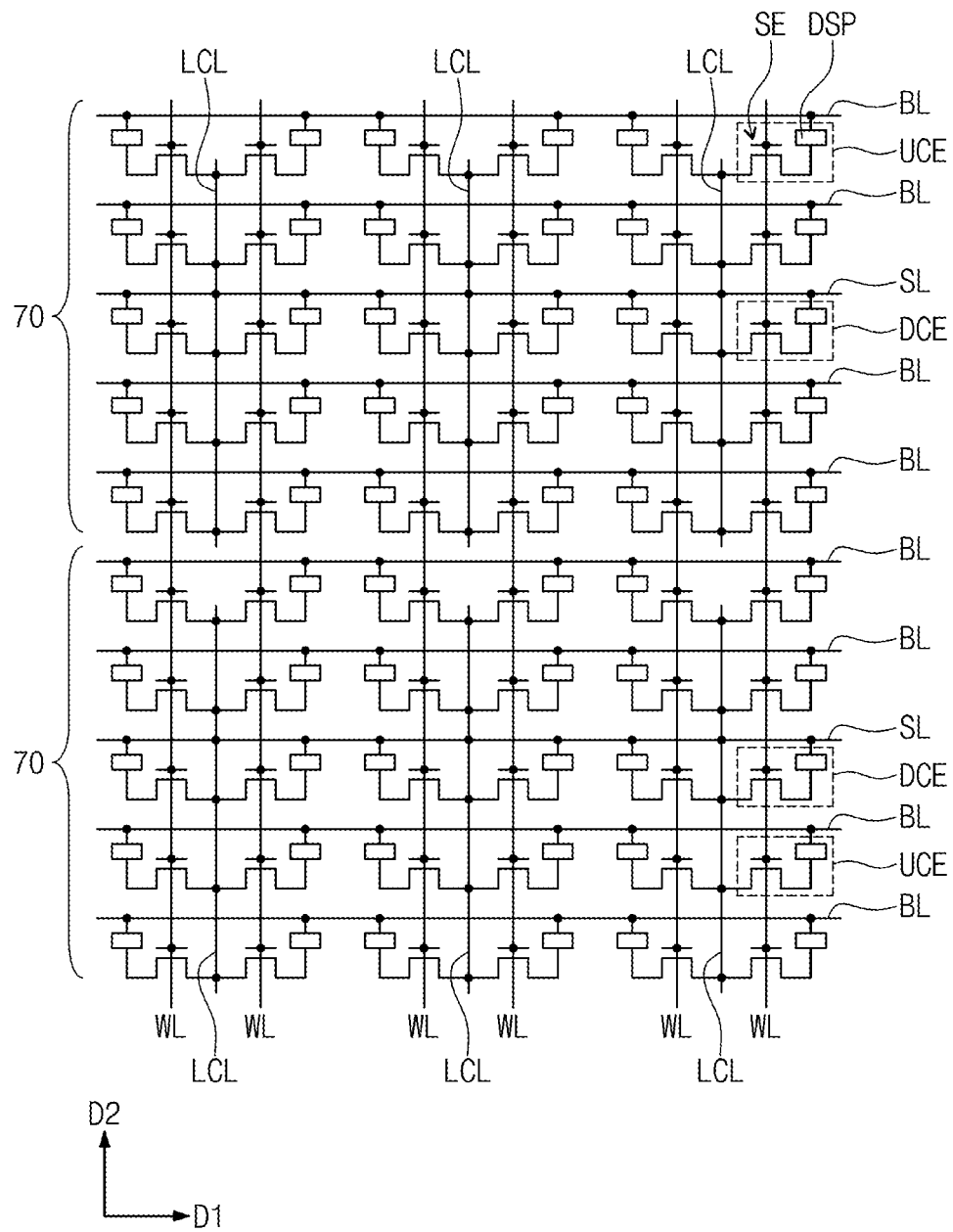

FIG. 2 is a circuit diagram illustrating a cell array in a cell array block of a semiconductor memory device according to example embodiments of the inventive concept.

Referring to FIGS. 1 and 2, cells UCE and DCE may be two-dimensionally arranged in rows and columns in each of the cell array blocks 50. The rows may be parallel to a first direction D1, and the columns may be parallel to a second direction D2 perpendicular to the first direction D1. Each of the cells UCE and DCE may include a selection element SE and a data storage part DSP connected to one terminal of the selection element SE.

The selection element SE may be a transistor having three terminals. In other words, the selection element SE may include a gate electrode, a source terminal, and a drain terminal. The data storage part DSP may store logic data. A first terminal of the data storage part DSP may be connected to the drain terminal of the selection element SE. In an embodiment, the data storage part DSP may be a variable resistor.

A word line WL may be connected to the gate electrodes of the selection elements SE of the cells UCE and DCE constituting each of the columns. In other words, a plurality of the word lines WL may be disposed in each of the cell array block 50 to correspond to the columns, respectively. The word lines WL may extend in parallel to each other in the second direction D2. In an example embodiment, an odd-numbered column and an even-numbered column adjacent to each other may constitute a column-pair in each of the cell array block 50. A plurality of the column-pairs may be disposed in each of the cell array block 50. The cells UCE and DCE of the odd-numbered column and the cells UCE and DCE of the even-number column may be symmetric in each of the column-pairs. In each of the column-pairs, the source terminals of an odd-numbered cell and an even-numbered cell adjacent to each other in the first direction D1 may be connected to each other. In an example embodiment, the odd-numbered and even numbered cells adjacent to each other in the first direction D1 may share one source terminal in each of the column-pairs.

Second terminals of the data storage parts DSP of the cells UCE or DCE constituting each of the rows may be connected to a conductive line BL or SL. In other words, the data storage part DSP may be connected between the drain terminal of the selection element SE and the conductive line BL or SL. A plurality of the conductive lines BL and SL are disposed in each of the cell array block 50 to correspond to the rows, respectively. The conductive lines BL and SL may extend in parallel to each other in the first direction D1.

The cells UCE and DCE in each of the cell array blocks 50 may be classified into a plurality of cell subgroups 70. Each of the cell subgroups 70 includes cells UCE and DCE arranged along a plurality of rows adjacent to each other. Each of the cell subgroups 70 further includes a plurality of the conductive lines BL and SL respectively corresponding to the plurality of the rows included in each of the cell subgroups 70. In an example embodiment, the plurality of conductive lines BL and SL in each of the cell subgroups 70 includes a source line SL and a plurality of bit lines BL. In an example embodiment, the number of the bit lines BL in each of the cell subgroups 70 may be at least four.

The source terminals of all of the cells UCE and DCE in each of the cell subgroups 70 are electrically connected to the source line SL in each of the cell subgroups 70. The source lines SL respectively included in the cell subgroups 70 are controlled independently from each other. In other words, the source line SL included in one of the cell subgroups 70 may be controlled independently from the source lines SL included in the others of the cell subgroups 70. That is, the source line SL in one selected from the cell subgroups 70 may be controlled independently from the source lines SL in unselected cell subgroups 70 of the cell subgroups 70. During a program operation and/or a sensing operation of the semiconductor memory device, a reference voltage may be applied to the source line SL of the selected cell subgroup 70, but the source lines SL of the unselected cell subgroups 70 may be applied with a voltage different from the reference voltage or may be floated. Thus, in the program operation and/or the sensing operation, the reference voltage may be applied to the source terminals of the cells UCE and DCE of the selected cell subgroup 70, but the source terminals of the cells UCE and DCE of the unselected cell subgroups 70 may be applied with the voltage different from the reference voltage or may be floated.

Each column including the cells UCE and DCE arranged in the second direction D2 may be classified into a plurality of sub-columns which are included in the plurality of cell subgroups 70, respectively. The number of the cells UCE and DCE constituting each of the sub-columns may be equal to the number of the rows in each of the cell subgroups 70. Likewise, each of the column-pairs may be classified into a plurality of sub-column-pairs respectively included in the plurality of cell subgroups 70.

In each of the cell subgroups 70, the source line SL may be electrically connected to the source terminals of the cells UCE and DCE through local interconnection lines LCL. The local interconnection lines LCL in one of the cell subgroups 70 are separated from the local interconnection lines LCL in the others of the cell subgroups 70. Each of the local connection lines LCL may extend in parallel to the word line WL and may be connected to the source terminals of the cells UCE and DCE arranged in the second direction D2 in each of the cell subgroups 70.

In an example embodiment, each of the local interconnection lines LCL may be connected to the source terminals of the cells UCE and DCE constituting each of the sub-column-pairs. Each of the local interconnection lines LCL may be disposed between a pair of the word lines WL in each of the sub-column-pairs. A plurality of the local interconnection lines LCL may be disposed between the pair of word lines WL in the column-pair of the cell array block 50. The local interconnection lines LCL between the pair of word lines WL in the column-pair may be separated from each other and may be arranged in the second direction D2. The local interconnection lines LCL between the pair of word lines WL in the column-pair may be included in the plurality of cell subgroups 70, respectively. In an embodiment, the local interconnection line LCL may not be disposed between the sub-column-pairs adjacent to each other in each of the cell subgroups 70. The pair of the word lines WL in the column-pair may extend in the second direction D2 throughout the plurality of cell subgroups 70.

Each of the cell subgroups 70 may include a plurality of the sub-column-pairs arranged along the first direction D1. The sub-column-pairs in each of cell subgroups 70 may extend in parallel to each other in the second direction D2. Thus, the each of the cell subgroups 70 may include a plurality of the local interconnection lines LCL corresponding to the plurality of sub-column-pairs, respectively.

The source line SL in each of the cell subgroups 70 may be connected to the local interconnection lines LCL in each of the cell subgroups 70. Thus, the source line SL may be electrically connected to the source terminals of the cells UCE and DCE in each of the cell subgroups 70.

In each of the cell subgroups 70, the bit lines BL and the source line SL may be arranged at equal intervals. In an example embodiment, as illustrated in FIG. 2, the source line SL may be disposed at a center of each of the cell subgroups 70 in a plan view. In other words, the number of the bit lines BL disposed at a side of the source line SL may be equal to the number of the bit lines BL disposed at another side of the source line SL in each of the cell subgroups 70. Thus, it is possible to improve uniformity of the reference voltage applied to the cells UCE and DCE of each of the cell subgroups 70 through the source line SL. However, example embodiments of the inventive concept are not limited thereto. The position of the source line SL may be changed in each of the cell subgroups 70.

The cells UCE connected to the bit lines BL may be unit cells storing logic data, and the cells DCE connected to the source line SL may be dummy cells. In other words, the unit cells UCE connected to the bit lines BL may function as unit cells of the semiconductor memory device, and the dummy cells DCE connected to the source line SL do not function as the unit cells of the semiconductor memory device. The dummy cells DCE connected to the source line SL may constitute a dummy row.

The source terminal of the selection element SE of the dummy cell DCE may be electrically connected to the source line SL through the local connection line LCL. The drain terminal of the selection element SE of the dummy cell DCE may also be electrically connected to the source line SL. Thus, the dummy cell DCE does not function as the unit cell of the semiconductor memory device. Additionally, the dummy cell DCE may not influence the operation of the semiconductor memory device.

In an example embodiment, when a first program operation is performed on the data storage part DSP of a selected unit cell UCE, the reference voltage may be applied to the source line SL of the selected cell subgroup 70 including the selected unit cell UCE, and a first program voltage lower than the reference voltage may be applied to the bit line BL connected to the selected unit cell UCE in the selected cell subgroup 70. When a second program operation is performed on the data storage part of the selected unit cell UCE, the reference voltage may be applied to the source line SL of the selected cell subgroup 70, and a second program voltage higher than the reference voltage may be applied to the bit line BL connected to the selected unit cell UCE. In this case, the reference voltage may be higher than a ground voltage. However, example embodiments of the inventive concept are not limited thereto. In another example embodiment, the reference voltage may be the ground voltage.

The source lines SL may be connected to a selection circuit disposed in the first decoder part 55. When one of the unit cells UCE is selected in the cell array block 50, the source line SL of the cell subgroup 70 including the selected unit cell may be selected.

As described above, the number of the bit lines BL in each of the cell subgroups 70 may be at least four. Thus, each of the cell subgroups 70 may include at least four rows consisting of the unit cells UCE (hereinafter, referred to as 'a unit cell-row'). Additionally, each of the cell subgroups 70 may further include the row consisting of the dummy cells DCE connected to the source line SL (hereinafter, referred to as a dummy cell-row).

The rows may be arranged at equal intervals in each of the cell array blocks 50. In more detail, the unit cell-rows and the dummy cell-row may be arranged at equal intervals in each of the cell subgroups 70. In other words, a distance between the dummy cell-row and the unit cell-row adjacent thereto may be equal to a distance between the unit cell-rows adjacent to each other in each of the cell subgroups 70. Additionally, a distance between the cell subgroups 70 adjacent to each other may be equal to the distance between the adjacent unit cell-rows disposed in each of the cell subgroups 70.

According to the semiconductor memory device described above, the unit cells UCE in each of the cell array blocks 50 may be classified into the plurality of cell subgroups 70, and the source lines SL respectively included in the cell subgroups 70 may be controlled independently from each other. Thus, the reference voltage may be selectively applied to the cell subgroups 70. In other words, the reference voltage may be applied to the source line SL of one selected from the cell subgroups 70, but the source lines SL of unselected cell subgroups 70 may be applied with a voltage different from the reference voltage or may be floated. As a result, power consumption of the semiconductor memory device may be reduced and an operating speed of the semiconductor memory device may be improved. Additionally, each of the cell subgroups 70 includes a plurality of the rows consisting of the unit cells UCE. Thus, the source line SL is shared by the plurality of rows consisting of the unit cells UCE in each of the cell subgroups 70. As a result, integration density of the semiconductor memory device may be improved.

If source terminals of all cells in a cell array block are connected to each other, the reference voltage may be applied to all the cells in the cell array block. Thus, power consumption of a semiconductor memory device may increase and an operating speed of the semiconductor memory device may be reduced. Alternatively, if source lines respectively corresponding to bit lines are disposed in the cell array block, integration density of the semiconductor memory device may be greatly lowered.

However, according to aforementioned example embodiments of the inventive concept, the unit cells UCE in the cell array block 50 may be classified into the plurality of cell subgroups 70, and the unit cells UCE of the unit cell rows in the cell subgroup 70 share the source line SL. Additionally, the source lines SL respectively included in the cell subgroups 70 are controlled independently from each other. As a result, the highly integrated semiconductor memory device may be realized to have the low power consumption and the high operating speed.

Moreover, if a bad cell occurs, the bad cell may be effectively repaired because the source lines SL are controlled independently from each other. In an example embodiment, only the cell sub group 70 including the bad cell may be repaired with redundancy cells. Thus, an area occupied by the redundancy cells may be reduced to efficiently perform the repairing process.

If source terminals of all the cells in the cell array block are connected to each other, the whole cell array block 50 including the bad cell may be repaired. In this case, the semiconductor memory device may require a redundancy cell block corresponding to the cell array block. Thus, an area occupied by the redundancy cells may increase. However, according to example embodiments of the inventive concept described above, the cell array block 50 is classified into the plurality of cell subgroups 70, and the source lines SL respectively included in the plurality of cell subgroups 70 are controlled independently from each other. Thus, if the bad cell occurs, only the cell subgroup 70 including the bad cell may be repaired. As a result, a redundancy cell block corresponding to the cell subgroup 70 may be disposed in the semiconductor memory device, such that the area occupied by the redundancy cells may be reduced. Thus, the integration density of the semiconductor memory device may be improved, and the efficiency of the repairing process may be improved.

Next, example embodiments including the semiconductor memory device of FIG. 2 realized on a semiconductor substrate will be described with reference to drawings.

Figure 3A:
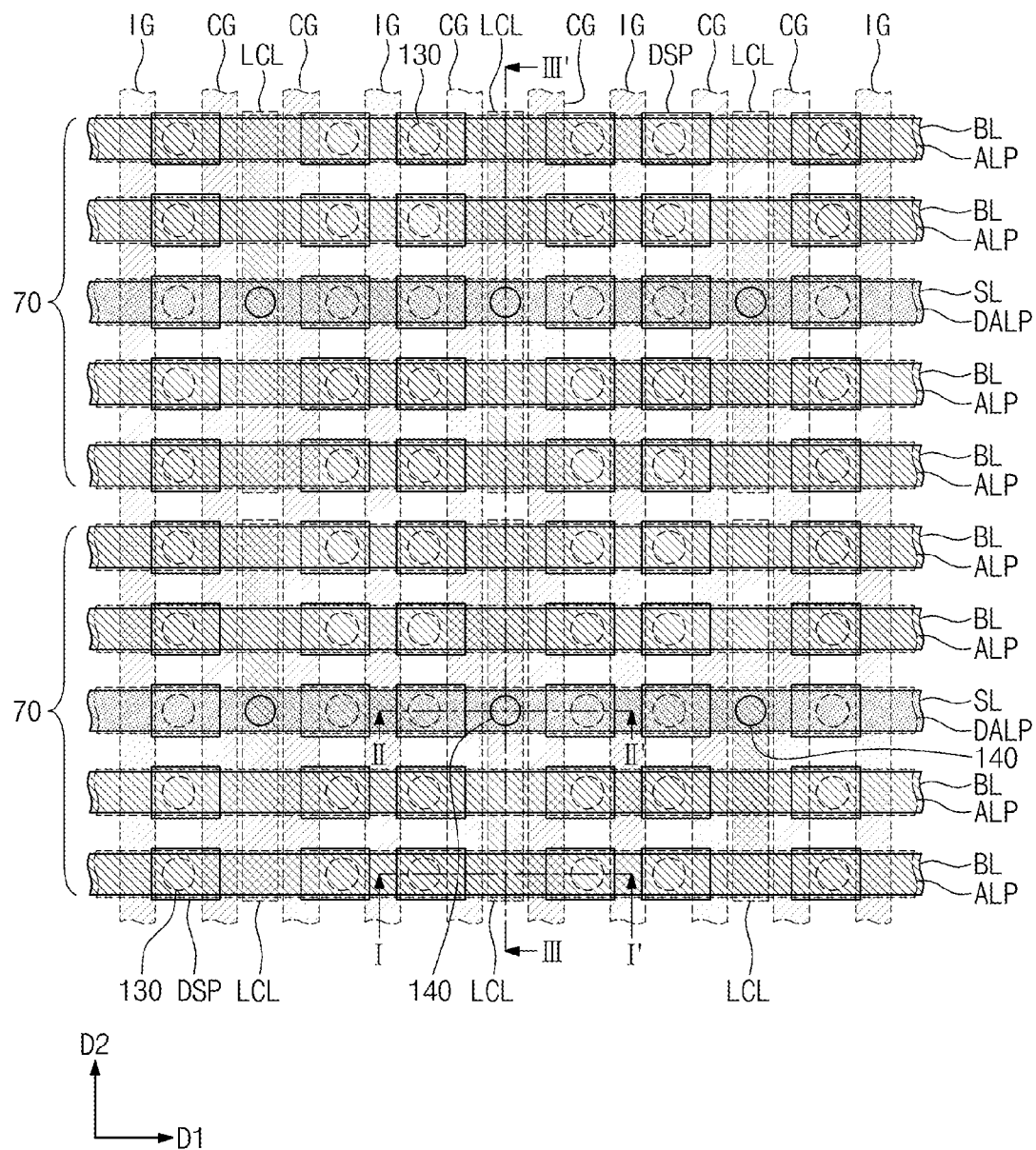
FIG. 3A is a plan view illustrating a cell array of a semiconductor memory device according to example embodiments of the inventive concept.
Figure 3B:
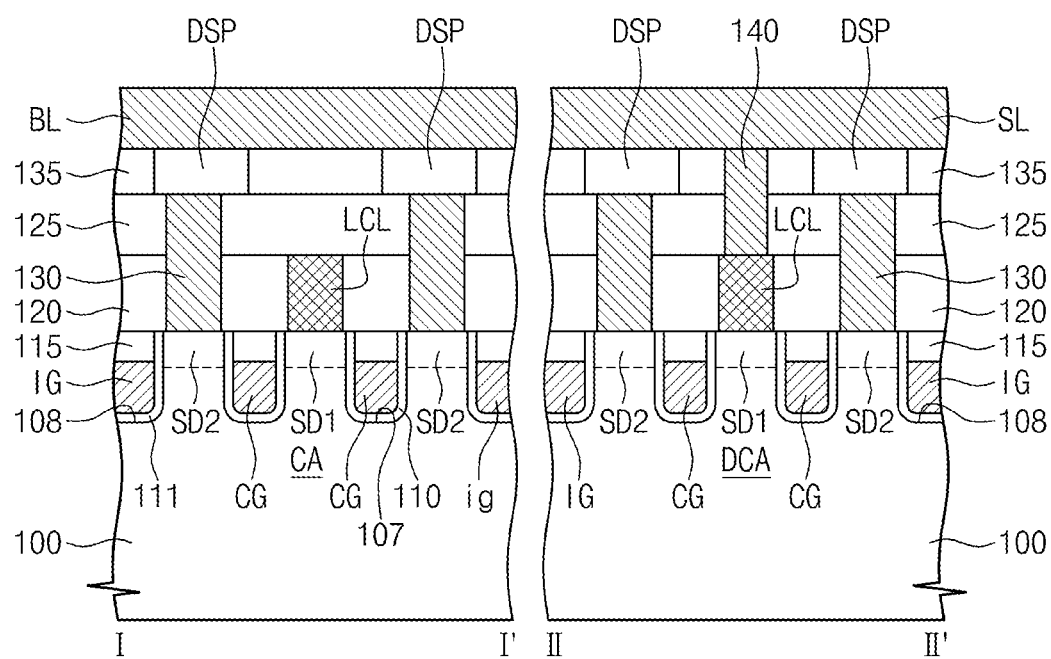
FIG. 3B is a cross-sectional view taken along lines I-I' and II-II' of FIG. 3A.
Figure 3C:
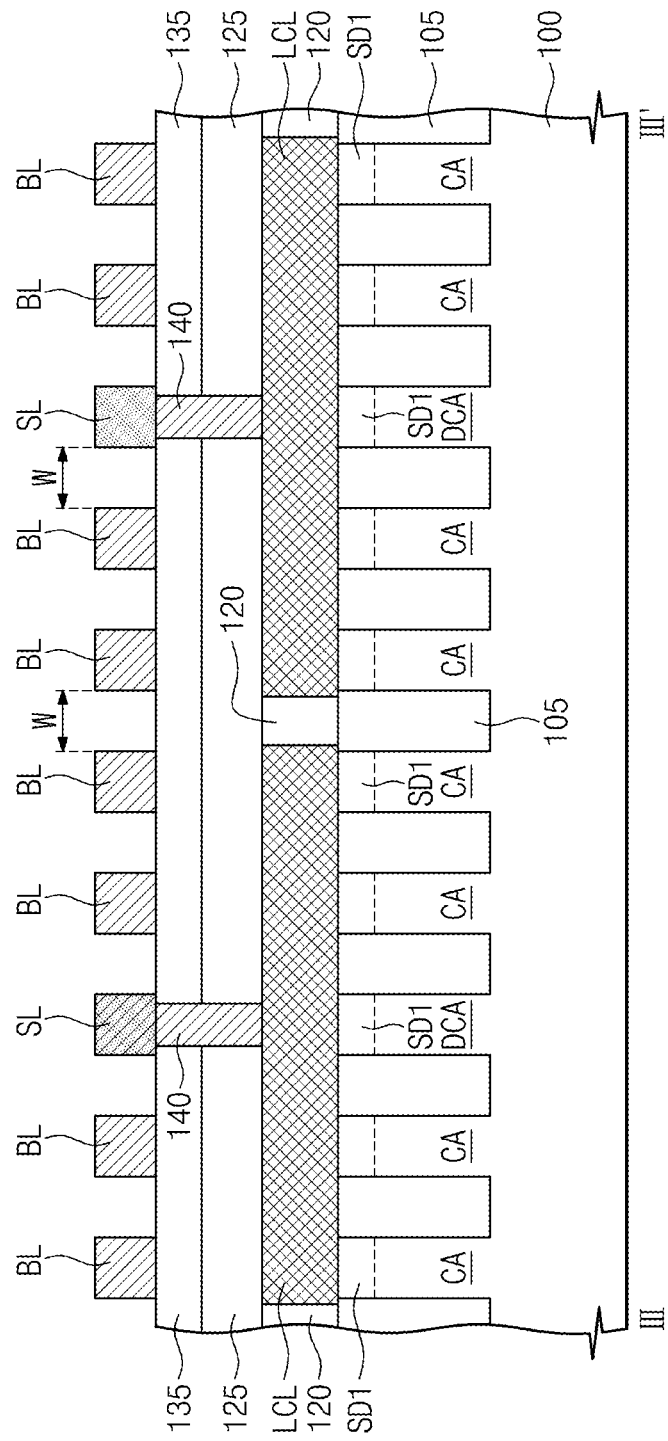
FIG. 3C is a cross-sectional view taken along a line III-III' of FIG. 3A.

FIG. 3A is a plan view illustrating a cell array of a semiconductor memory device according to example embodiments of the inventive concept. FIG. 3B is a cross-sectional view taken along lines I-I' and II-II' of FIG. 3A. FIG. 3C is a cross-sectional view taken along a line III-III' of FIG. 3A.

Referring to FIGS. 3A, 3B, and 3C, device isolation patterns 105 may be disposed on or in a semiconductor substrate 100 (hereinafter, referred to as 'a substrate') to define active line patterns ALP an DALP. FIG. 3A illustrates the active line patterns ALP and DALP disposed in one cell array block 50 of FIG. 1.

In a plan view, the active line patterns ALP and DALP may extend in parallel to each other in a first direction D1. The active line patterns ALP and DALP may be arranged at equal intervals. The device isolation patterns 105 may also extend in parallel to each other in the first direction D1. The device isolation patterns 105 and the active line patterns ALP and DALP may be alternately arranged in a second direction D2 perpendicular to the first direction D1 in a plan view. For example, the substrate 100 may be a silicon substrate, a germanium substrate, or a silicon-germanium substrate. The device isolation patterns 105 may be trench-type device isolation patterns and may include an oxide (e.g., silicon oxide), a nitride (e.g., silicon nitride), and/or an oxynitride (e.g., silicon oxynitride). The active line patterns ALP and DALP may be doped with dopants of a first conductivity type.

The active line patterns ALP and DALP may be classified into a plurality of cell subgroups 70. Each of the cell subgroups 70 may include a plurality of the active line patterns ALP and DALP. Each of the cell subgroups 70 may include a dummy active line pattern DALP and a plurality of cell active line patterns ALP. Each of the cell subgroups 70 may include at least four cell active line patterns ALP. In an example embodiment, the dummy active line pattern DALP may be disposed at a center of each of the cell subgroups 70. In other words, the number of the cell active line patterns ALP disposed at a side of the dummy active line pattern DALP may be equal to the number of the cell active line patterns ALP disposed at another side of the dummy active line pattern DALP in each of the cell subgroups 70. However, the inventive concept is not limited thereto.

Isolation gate electrodes IG may be disposed in isolation grooves 108 crossing the active line patterns ALP and DALP and the device isolation patterns, respectively. The isolation grooves 108 may extend in parallel to each other. Bottom surfaces of the isolation grooves 108 are lower than top surfaces of the active line patterns ALP and DALP and top surfaces of the device isolation patterns 105. By the isolation gate electrodes IG, each of the cell active line patterns ALP may be divided into a plurality of cell active portions CA, and each of the dummy active line patterns DALP may be divided into a plurality of dummy active portions DCA. In other words, each of the active portions CA and DCA may be surrounded by a pair of the isolation gate electrodes IG adjacent to each other and a pair of the device isolation patterns 105 adjacent to each other in a plan view.

The isolation gate electrodes IG may extend parallel to each other in the second direction D2. The active portions CA or DCA divided from each of the active line patterns ALP and DALP may be arranged in the first direction D1, so as to constitute a row. The active portions CA and DCA between the isolation gate electrodes IG adjacent to each other may be arranged in the second direction D2, so as to constitute a column. In other words, the active portions CA and DCA may be two-dimensionally arranged along the rows and columns at the substrate 100. Each of the cell subgroups 70 includes a plurality of the rows. In an example embodiment, each of the cell subgroups 70 may include the row consisting of the dummy active portions DCA and at least four rows consisting of the cell active portions CA.

A pair of cell gate electrodes CG may be disposed in a pair of cell grooves 107 crossing the active portions CA and DCA constituting each of the columns, respectively. The cell gate electrodes CG may be parallel to the isolation gate electrodes IG. Bottom surfaces of the cell grooves 107 are lower than the top surfaces of the device isolation patterns 105 and the active portions CA and DCA. The cell gate electrodes CG may correspond to the word lines WL of FIG. 2.

A first doped region SD1 may be disposed in each of the active portion CA and DCA between the pair of cell gate electrodes CG. A pair of second doped regions SD2 may be disposed in both edge portions of each of the active portions CA and DCA, respectively. The pair of cell gate electrodes CG may be disposed between the pair of second doped regions SD2 in a plan view. The first doped regions SD1 formed in the active portions CA and DCA of each of the columns may be arranged in a line along the second direction D2. The second doped regions SD2 formed in the active portions CA and DCA of each of the columns may be arranged in two lines along the second direction D2.

The first and second doped regions SD1 and SD2 may be doped with dopants of a second conductivity type. One of the first conductivity type and the second conductivity type may be an N-type, and the other of the first conductivity type and the second conductivity type may be a P-type. The first doped region SD1 may correspond to the source terminal of the selection element SE of FIG. 2, and the second doped region SD2 may correspond to the drain terminal of the selection element SE of FIG. 2.

A cell gate insulating layer 110 may be disposed between the cell gate electrode CG and an inner surface of the cell groove 107, and an isolation gate insulating layer 111 may be disposed between the isolation gate electrode IG and an inner surface of the isolation groove 108. The cell and isolation gate insulating layers 110 and 111 may be formed of the same insulating material. For example, the cell and isolation gate insulating layers 110 and 111 may include an oxide (e.g., silicon oxide), a nitride (e.g., silicon nitride), an oxynitride (e.g., silicon oxynitride), and/or a high-k dielectric. The isolation and cell gate electrodes IG and CG may include the same conductive material. For example, the isolation and cell gate electrodes IG and CG may include at least one of a doped semiconductor material (e.g., doped silicon), a metal (e.g., titanium, tantalum, tungsten, and/or copper), a conductive metal nitride (e.g., titanium nitride, tantalum nitride, and/or tungsten nitride), and a metal-semiconductor compound (e.g., a metal silicide).

When a semiconductor memory device is operated, an isolation voltage may be applied to the isolation gate electrodes IG. The isolation voltage may prevent channels from being formed under the inner surfaces of the isolation grooves 108. In other words, isolation channel regions under the isolation gate electrodes IG may be turned-off by the isolation voltage. Thus, the active portions CA and DCA may be electrically isolated from each other. For example, if the active line patterns ALP and DALP are doped with P-type dopants, the isolation voltage may be a ground voltage or a negative voltage.

Top surfaces of the gate electrodes CG and IG may be lower than the top surfaces of the active portions CA and DCA. Capping insulation patterns 115 may be disposed on the gate electrodes CG and IG, respectively. Each of the capping insulation patterns 115 may fill each of the grooves 107 and 108 on each of the gate electrodes CG and IG. Top surfaces of the capping insulation patterns 115 may be substantially coplanar with the top surfaces of the active portions CA and DCA. The capping insulation patterns 115 may include an oxide (e.g., silicon oxide), a nitride (e.g., silicon nitride), and/or an oxynitride (e.g., silicon oxynitride).

The pair of cell gate electrodes CG and the first and second doped regions SD1 and SD2 formed in each of the active portions CA and DCA may constitute a pair of transistors. The transistors formed in the active portions CA and DCA constituting each of the columns may be the selection elements SE of the cells UCE and DCE constituting the column-pair described with reference to FIG. 2.

The active portions CA and DCA constituting each of the columns may be classified into a plurality of sub-columns that are included in the plurality of cell subgroups 70, respectively. Thus, the active portions CA and DCA in each of the cell subgroups 70 may be two-dimensionally arranged along the plurality of rows and the sub-columns. The sub-columns in each of the cell subgroups 70 may extend parallel to each other the second direction D2.

A local interconnection line LCL may be disposed on the substrate 100, so as to be connected to the first doped regions SD1 in the active portions CA and DCA constituting each of the sub-columns. Thus, a plurality of the local interconnection lines LCL may be disposed to correspond to the plurality of sub-columns in each of the cell subgroups 70, respectively.

The local interconnection lines LCL in each of the cell subgroups 70 may extend parallel to each other in the second direction D2. In other words, the local interconnection lines LCL may be parallel to the gate electrodes IG and CG.

The local interconnection lines LCL in each of the cell subgroups 70 are spaced apart from the local interconnection lines LCL in a neighboring cell subgroup 70. In other words, the local interconnection lines LCL may be disposed on the active portions CA and DCA of each of the columns. The local interconnection lines LCL disposed on the active portions CA and DCA of each of the columns may be spaced apart from each other and may be arranged along the second direction D2. The local interconnection lines LCL disposed on the active portions CA and DCA of each of the columns may be included in the plurality of cell subgroups 70, respectively.

The local interconnection lines LCL are formed of a conductive material. For example, the local interconnection lines LCL may include at least one of a doped semiconductor material (e.g., doped silicon), a metal (e.g., titanium, tantalum, tungsten, and/or copper), a conductive metal nitride (e.g., titanium nitride, tantalum nitride, and/or tungsten nitride), and a metal-semiconductor compound (e.g., a metal silicide).

A first interlayer dielectric layer 120 may be disposed on the substrate 100. The local interconnection lines LCL may be disposed in the first interlayer dielectric layer 120. In an example embodiment, top surfaces of the local interconnection lines LCL may be substantially coplanar with a top surface of the first interlayer dielectric layer 120. The first interlayer dielectric layer 120 may include an oxide (e.g., silicon oxide), a nitride (e.g., silicon nitride), and/or an oxynitride (e.g., silicon oxynitride).

A second interlayer dielectric layer 125 may be disposed on the first interlayer dielectric layer 120 and the local interconnection lines LCL. The second interlayer dielectric layer 125 may include an oxide (e.g., silicon oxide), a nitride (e.g., silicon nitride), and/or an oxynitride (e.g., silicon oxynitride).

Data storage parts DSP may be disposed on the second interlayer dielectric layer 125. The data storage parts DSP may be electrically connected to the second doped regions SD2, respectively. The data storage parts may overlap with the second doped regions SD2, respectively. The data storage parts DSP may be two-dimensionally arranged along rows and columns. A pair of the data storage parts DSP may be disposed over each of the active portions CA and DCA. Each of the data storage parts DSP may be electrically connected to each of the second doped regions SD2 through a contact plug 130 successively penetrating the second and first interlayer dielectric layers 125 and 120.

The data storage part DSP may include a variable resistor of which a resistance state is capable of being converted into any one of a plurality of resistance states having resistance values different from each other. The data storage part DSP will be described in more detail later. The contact plugs 130 may be formed of a conductive material. For example, the contact plugs 130 may include at least one of a doped semiconductor material (e.g., doped silicon), a metal (e.g., titanium, tantalum, tungsten, and/or copper), a conductive metal nitride (e.g., titanium nitride, tantalum nitride, and/or tungsten nitride), and a metal-semiconductor compound (e.g., a metal silicide).

A third interlayer dielectric layer 135 may be disposed on the second interlayer dielectric layer 125. The third interlayer dielectric layer 135 may fill a space between the data storage parts DSP. In an example embodiment, the third interlayer dielectric layer 135 may have a top surface substantially coplanar with top surfaces of the data storage parts DSP. The third interlayer dielectric layer 135 may include an oxide (e.g., silicon oxide), a nitride (e.g., silicon nitride), and/or an oxynitride (e.g., silicon oxynitride).

Conductive lines BL and SL may be disposed on the third interlayer dielectric layer 135. The conductive lines BL and SL may extend in parallel to each other in the first direction D1. The conductive lines BL and SL may be arranged at equal intervals.

Each of the conductive lines BL and SL may be connected to the data storage parts DSP constituting each row. The conductive lines BL and SL may respectively overlap with the active line patterns ALP and DALP divided into the active portions CA and DCA. The conductive lines BL and SL include a bit line BL and a source line SL. The bit line is disposed over the cell active portions CA which are arranged in the first direction D1 to constitute one row, and the source line is disposed over the dummy active portions DCA which are arranged in the first direction D1 to constitute one row. Thus, a plurality of the bit lines BL and the source line SL are disposed in each of the cell subgroups 70. The bit line BL and the source line may be disposed at substantially the same height from the top surface of the substrate 100.

As described above, in an example embodiment, because each of the cell subgroups 70 includes at least four cell active lines ALP, each of the cell subgroups 70 may include at least four bit lines BL. The bit and source lines BL and SL may be formed of the same conductive material. For example, the bit and source lines BL and SL may include at least one of a metal (e.g., tungsten, copper, titanium, and/or tantalum) and a conductive metal nitride (e.g., titanium nitride, tantalum nitride, and/or tungsten nitride).

In an example embodiment, as illustrated in FIG. 3B, the bit line BL may be in contact with the top surfaces of the data storage parts DSP under the bit line BL. Likewise, the source line SL may be in contact with the top surface of the data storage parts DSP under the source line SL. Alternatively, the third interlayer dielectric layer 135 may extend to be disposed between each of the conductive lines BL and SL and the data storage parts DSP. In this case, the bit line BL may be connected to the data storage part DSP through an upper contact plug (not shown) penetrating the third interlayer dielectric layer 135 between the bit line BL and the data storage part DSP. In this case, an upper contact plug (not shown) may also be disposed to penetrate the third interlayer dielectric layer 135 between the source line SL and the data storage part DSP under the source line SL. Alternatively, the upper contact plug between the source line SL and the data storage part DSP may be omitted. In other words, the source line SL may be electrically insulated from the data storage part DSP under the source line SL.

As described above, the conductive lines BL and SL may be arranged at equal intervals. Thus, a distance W between the source line SL and the bit line BL adjacent thereto may be equal to a distance W between the bit lines BL adjacent to each other, as illustrated in FIG. 3C. Additionally, a distance between the cell subgroups 70 adjacent to each other may be equal to the distance W between the adjacent bit lines BL.

In each of the cell subgroups 70, the source line SL is electrically connected to the local interconnection lines LCL. The source line SL may be electrically connected to the local interconnection lines LCL through source plugs 140 successively penetrating the third and second interlayer dielectric layers 135 and 125. Each of the source plugs 140 may be disposed in a crossing region of the source line SL and each of the local interconnection lines LCL. The source line SL is electrically connected to the first doped regions SD1 in each of the cell subgroups 70 through the local interconnection lines LCL.

As illustrated in FIG. 3B, a width of a bottom surface of the source plug 140 may be smaller than a width of the top surface of the local interconnection line LCL under the source plug 140 in a longitudinal direction (i.e., the first direction D1) of the source line SL. However, example embodiments of the inventive concept are not limited thereto. The source plug 140 is formed of a conductive material. For example, the source plug 140 may include at least one of a metal (e.g., tungsten, copper, titanium, and/or tantalum), a conductive metal nitride (e.g., titanium nitride, tantalum nitride, and/or tungsten nitride), and a metal-semiconductor compound (e.g., a metal silicide).

As described above, the local interconnection lines LCL in each cell subgroup 70 are spaced apart from the local interconnection lines LCL in the neighboring cell subgroup 70. Thus, the source line SL in one of the cell subgroups 70 is electrically insulated from the first doped regions SD1 in the others of the cell subgroups 70. As mentioned with reference to FIG. 2, the source lines SL respectively included in the cell subgroups 70 are controlled independently from each other. Thus, in program operation and/or sensing operation, a reference voltage may be applied to the first doped regions SD1 in one selected from the cell subgroups 70, but the first doped regions SD1 in unselected cell subgroups 70 may be applied with a voltage different from the reference voltage or may be floated.

The transistors formed in each of the cell active portions CA and the data storage parts DSP connected thereto may constitute a pair of unit cells. The unit cells may store logic data. The transistor formed in each of the dummy active portions DCA and the data storage parts DSP connected thereto may constitute a pair of dummy cells. The dummy cells do not function as the unit cells storing logic data.

In an example embodiment, the source line SL may be disposed at a center of each of the cell subgroups 70, as illustrated in FIG. 3A. In other words, the number of the bit lines BL disposed at a side of the source line SL may be equal to the number of the bit lines BL disposed at another side of the source line SL in each of the cell subgroups 70. However, example embodiments of the inventive concept are not limited thereto.

According to the semiconductor memory device described above, the active portions CA and DCA are arranged along the rows and columns at the substrate 100 in one cell array block, and the a pair of cells are realized at each of the active portions CA and DCA. The active portions CA and DCA in the one cell array block are classified into the plurality of cell subgroups 70, and each of the cell subgroups 70 includes the source line SL disposed over the row consisting of the dummy active portions DCA and the plurality of bit lines BL respectively disposed over the plurality of rows consisting of the cell active portions CA. In each of the cell subgroups 70, the source line SL is electrically connected to the first doped regions SD1 (i.e., source terminals of the transistors of the cells). Additionally, the source lines SL respectively included in the cell subgroups 70 are controlled independently from each other. Thus, it is possible to realize the semiconductor memory device having high operating speed, low power consumption, and high integration density.

Meanwhile, the source line SL may be disposed at another position except the center in the cell subgroup 70. This will be described with reference to FIG. 4.

Figure 4:
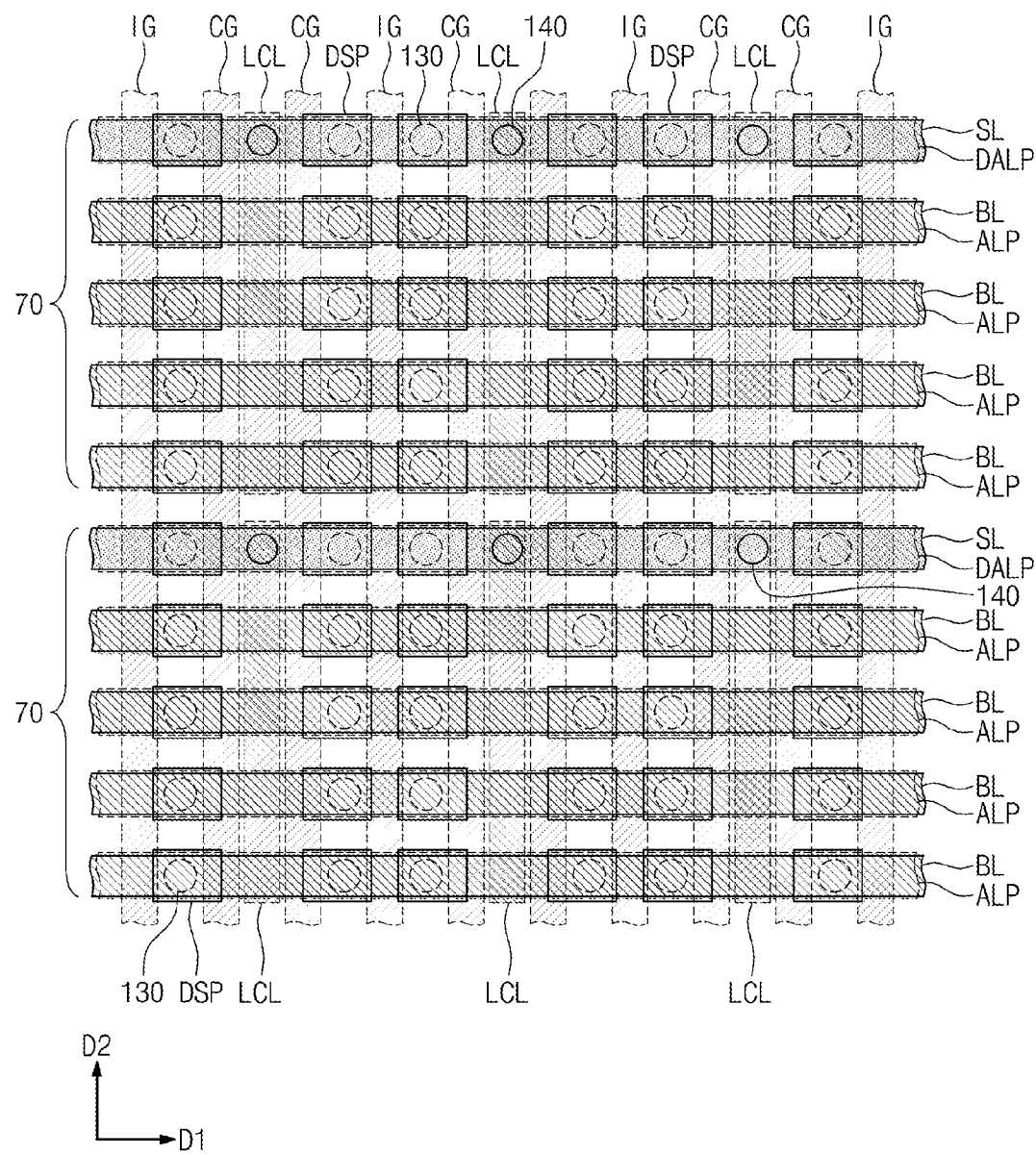

FIG. 4 is a plan view illustrating a modified example of a semiconductor memory device according to example embodiments of the inventive concept.

Referring to FIG. 4, the source line SL may be disposed at a side of the plurality of bit lines BL in each of the cell subgroups 70. In other words, the source line SL may be disposed at an edge of each of the cell subgroups 70. In this case, the dummy active line pattern DALP divided into the dummy active portions DCA is disposed under the source line SL. Alternatively, in each of the cell subgroups 70, the source line SL may be disposed between the bit lines BL, and the number of the bit lines BL disposed at a side of the source line SL may be different from the number of the bit lines disposed at another side of the source line SL. As a result, the source line SL may be disposed at a random position in each of the cell subgroups 70. However, in the present modified example, the source and bit lines SL and BL are also arranged at equal intervals in each of the cell subgroups 70.

In FIGS. 3A, 3B, and 3C, the width of the source plug 140 may be smaller than the width of the local interconnection line LCL. Alternatively, the source plug may have a different width. This will be described in more detail with reference to FIGS. 5A and 5B.

Figure 5A:
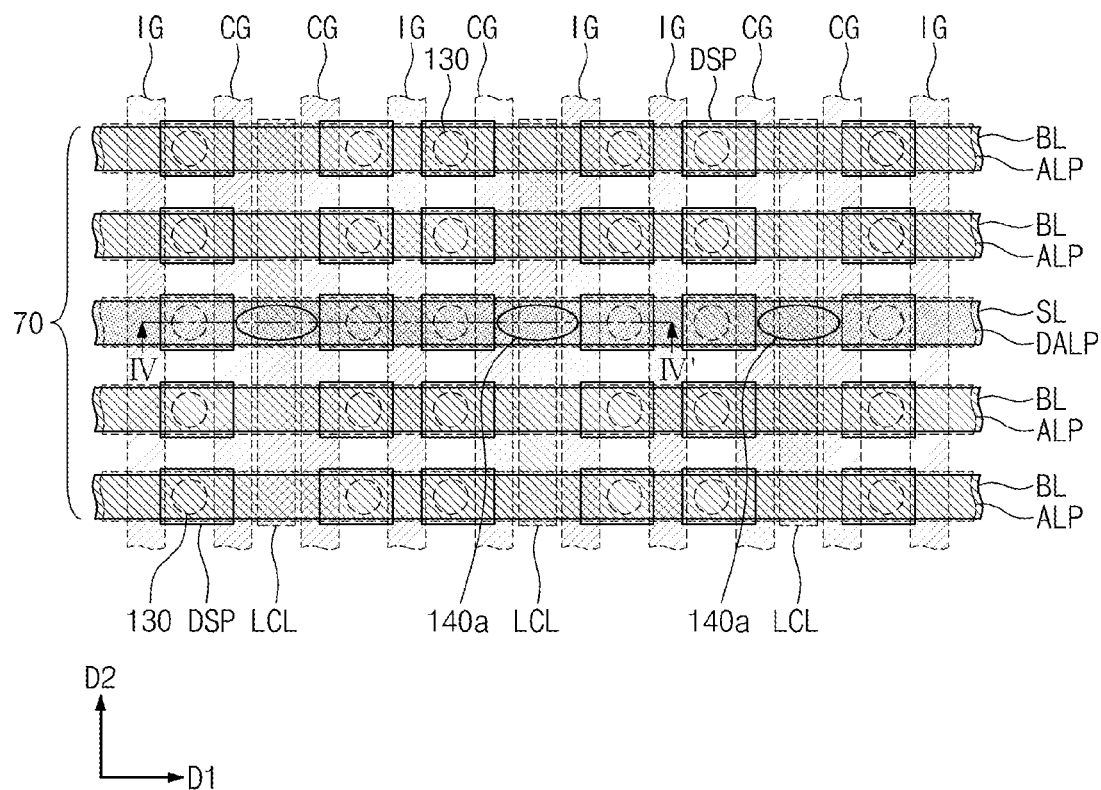
FIG. 5A is a plan view illustrating another modified example of a semiconductor memory device according to example embodiments of the inventive concept.
Figure 5B:
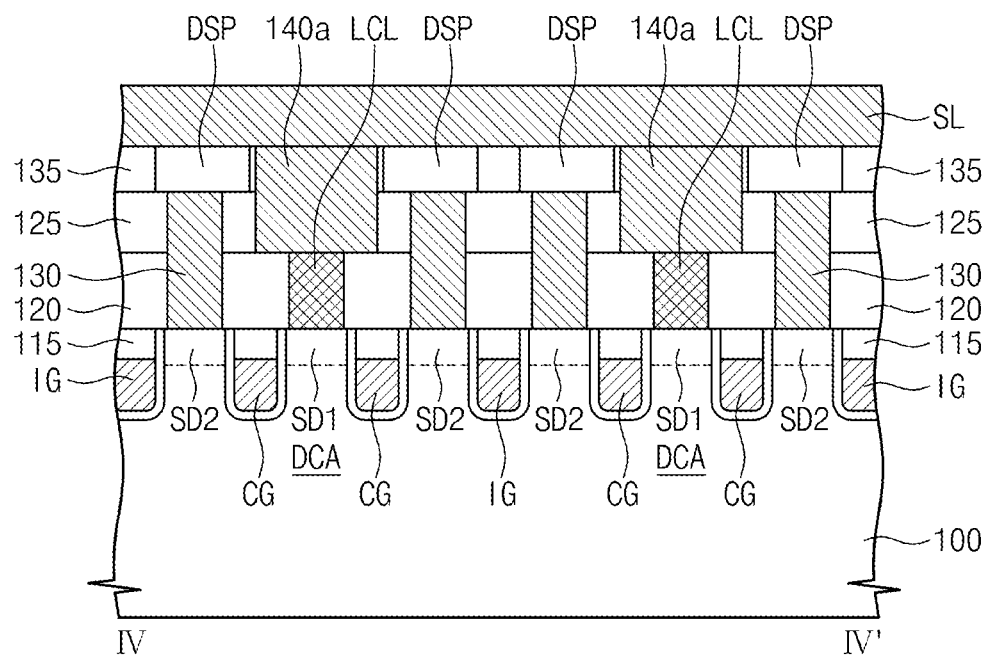
FIG. 5B is a cross-sectional view taken along a line IV-IV' of FIG. 5A.

FIG. 5A is a plan view illustrating another modified example of a semiconductor memory device according to example embodiments of the inventive concept. FIG. 5B is a cross-sectional view taken along a line IV-IV' of FIG. 5A. FIG. 5A illustrates one of the cell subgroups 70 for the purpose of ease and convenience in explanation.

Referring to FIGS. 5A and 5B, a source plug 140a may penetrate the third and second interlayer dielectric layers 135 and 125 between the source line SL and each of the local interconnection lines LCL. The source plug 140a may extend in the longitudinal direction of the source line SL in a plan view. Thus, a width of the bottom surface of the source plug 140a may be greater than a width of the local interconnection line LCL in the longitudinal direction (i.e., the first direction D1) of the source line SL. As a result, a contact area between the source plug 140a and the local interconnection line LCL may increase to reduce a resistance value between the source line SL and the first doped region SD1. Thus, the operating speed of the semiconductor memory device may be more improved. In an example embodiment, the source plug 140a may be in contact with the data storage part of the dummy cell adjacent thereto.

Next, the data storage part DSP will be described in more detail with reference to drawings.

Figure 6A:
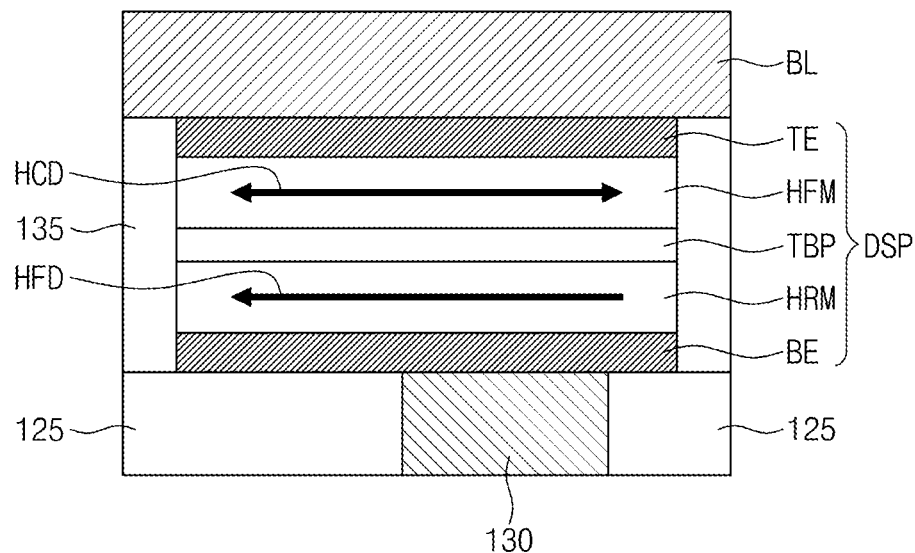
FIG. 6A is a cross-sectional view illustrating an example of a data storage part of a semiconductor memory device according to example embodiments of the inventive concept.

FIG. 6A is a cross-sectional view illustrating an example of a data storage part of a semiconductor memory device according to example embodiments of the inventive concept.

Referring to FIG. 6A, the data storage part DSP according to the present example may include a reference pattern HRM, a free pattern HFM, and a tunnel barrier pattern TBP disposed between the reference pattern HRM and the free pattern HFM. The reference pattern HRM has a magnetization direction HFD fixed in one direction. The free pattern HFM has a magnetization direction HCD configured to be changeable in parallel or anti-parallel with the magnetization direction HFD of the reference pattern HRM. The magnetization directions HFD and HCD of the reference and free patterns HRM and HFM may be in parallel with a surface of the tunnel barrier pattern TBP which is in contact with the free pattern HFM.

If the magnetization direction HCD of the free pattern HFM is parallel to the magnetization direction HFD of the reference pattern HRM, the data storage part DSP may have a first resistance value. If the magnetization direction HCD of the free pattern HFM is anti-parallel to the magnetization direction HFD of the reference pattern HRM, the data storage part DSP may have a second resistance value greater than the first resistance value. The data storage part DSP may store logic data by using the difference between the first and second resistance values. The magnetization direction HCD of the free pattern HFM may be changed by spin torque of electrons in a program current.

The reference pattern HRM and the free pattern HFM may include a ferromagnetic material. The reference pattern HRM may further include an anti-ferromagnetic material pinning the magnetization direction of the ferromagnetic material in the reference pattern HRM. The tunnel barrier pattern TBP may include at least one of magnesium oxide, titanium oxide, aluminum oxide, magnesium-zinc oxide, and magnesium-boron oxide.

The data storage part DSP may further include a bottom electrode BE and a top electrode TE. The reference, tunnel barrier and free patterns HRM, TBP, and HFM may be disposed between the bottom electrode BE and the top electrode TE. As illustrated in FIG. 6A, the reference pattern HRM may be disposed under the tunnel barrier pattern TBP, and the free pattern HFM may be disposed on the tunnel barrier pattern TBP. Alternatively, the free pattern HFM may be disposed under the tunnel barrier pattern TBP, and the reference pattern HRM may be disposed on the tunnel barrier pattern TBP. The bottom electrode BE and the top electrode TE may include a conductive metal nitride (e.g. titanium nitride, tantalum nitride, and/or tungsten nitride).

Figure 6B:
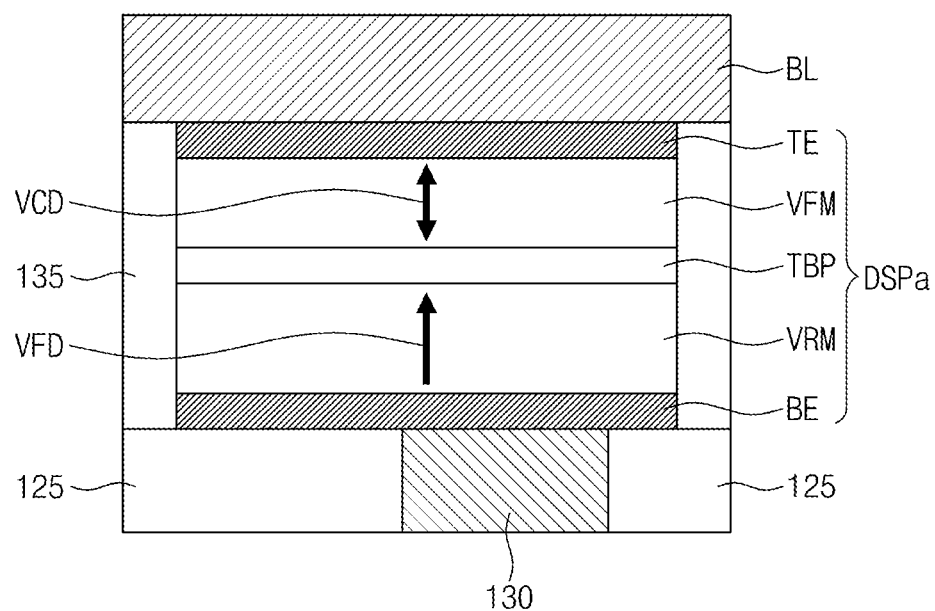
FIG. 6B is a cross-sectional view illustrating another example of a data storage part of a semiconductor memory device according to example embodiments of the inventive concept.

FIG. 6B is a cross-sectional view illustrating another example of a data storage part of a semiconductor memory device according to example embodiments of the inventive concept.

Referring to FIG. 6B, a data storage part DSPa according to the present example may include a reference perpendicular pattern VRM, a free perpendicular pattern VFM, and a tunnel barrier pattern TBP disposed between the reference perpendicular pattern VRM and the free perpendicular pattern VFM. The reference perpendicular pattern VRM may have a magnetization direction VFD fixed in one direction. The free perpendicular pattern VFM may have a magnetization direction VCD configured to be changeable in parallel or in anti-parallel with the magnetization direction VFD of the reference perpendicular pattern VRM. Here, the magnetization directions VFD and VCD of the reference and free perpendicular patterns VRM and VFM may be perpendicular to one surface of the tunnel barrier pattern TBP which is in contact with the free perpendicular pattern VFM.

The reference and free perpendicular pattern VRM and VFM may include at least one of a perpendicular magnetic material (e.g. CoFeTb, CoFeGd, and/or CoFeDy), a perpendicular magnetic material having an $L1_0$ structure, CoPt of a hexagonal close packed (HCP) lattice structure, and a perpendicular magnetic structure. The perpendicular magnetic material having the $L1_0$ structure may include FePt of the $L1_0$ structure, FePd of the $L1_0$ structure, CoPd of the $L1_0$ structure, and/or CoPt of the $L1_0$ structure. The perpendicular magnetic structure may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where the n is the number of alternately stacking the magnetic layer and the non-magnetic layer). The reference perpendicular pattern VRM may be thicker than the free perpendicular pattern VFM, and/or a coercive force of the reference perpendicular pattern VRM may be greater than a coercive force of the free perpendicular pattern VFM.

Figure 6C:
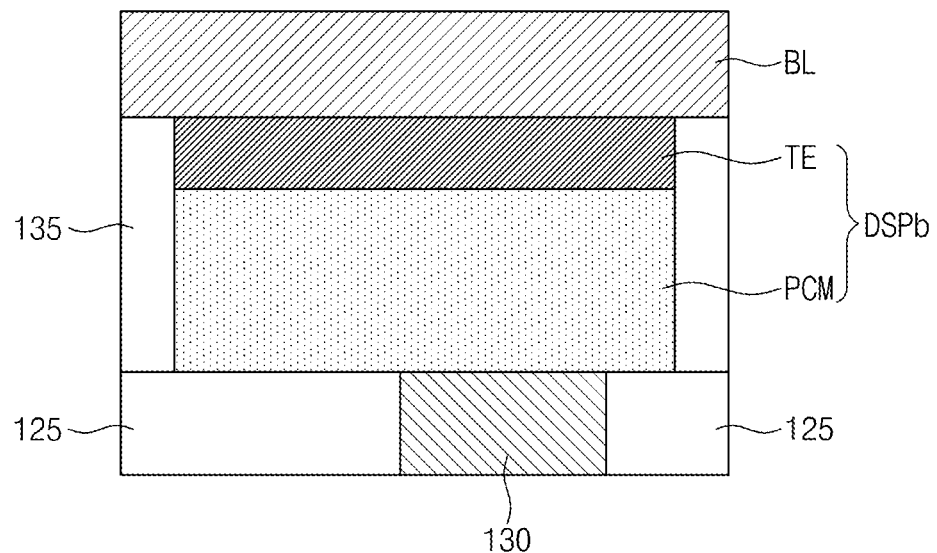
FIG. 6C is a cross-sectional view illustrating still another example of a data storage part of a semiconductor memory device according to example embodiments of the inventive concept.

FIG. 6C is a cross-sectional view illustrating still another example of a data storage part of a semiconductor memory device according to example embodiments of the inventive concept.

Referring to FIG. 6C, a data storage part DSPb according to the present example may include a phase change material pattern PCM and a top electrode TE that are sequentially stacked. A phase of the phase change material pattern PCM may be changed into a crystal state or an amorphous state according to a temperature of a supplied heat and/or a supplying time of the heat. The phase change material pattern PCM in the crystal state may have a resistivity lower than that of the phase change pattern PCM in the amorphous state. The data storage part DSPb may store the logic data using difference between the resistivity of the crystal state and the resistivity of the amorphous state. In an example embodiment, the contact plug 130 contacting the phase change material pattern PCM may be used as a heater electrode. The phase change material pattern PCM may include at least one of chalcogenide elements such as tellurium (Te) and selenium (Se).

Figure 6D:
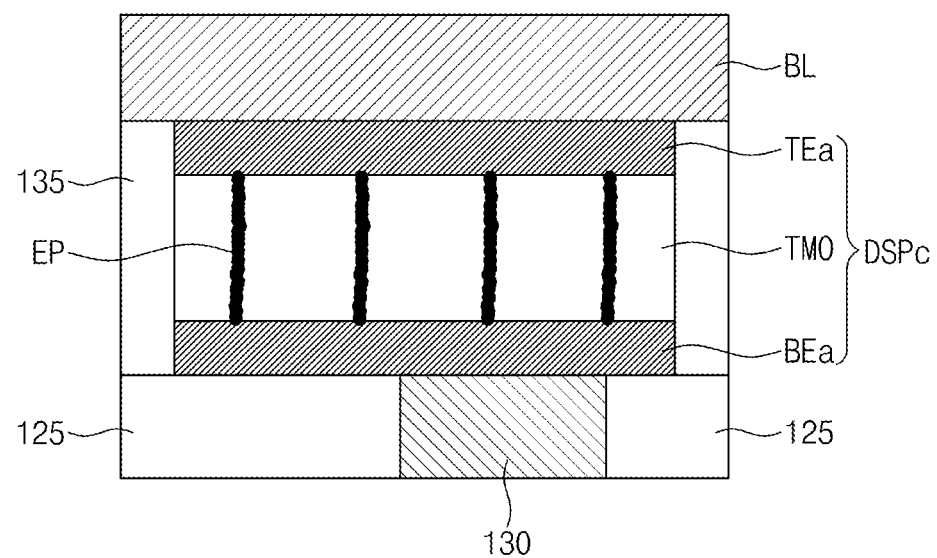
FIG. 6D is a cross-sectional view illustrating yet another example of a data storage part of a semiconductor memory device according to example embodiments of the inventive concept.

FIG. 6D is a cross-sectional view illustrating yet another example of a data storage part of a semiconductor memory device according to example embodiments of the inventive concept.

Referring to FIG. 6D, a data storage part DSPc according to the present example may include a bottom electrode BEa, a top electrode TEa, and a transition metal oxide pattern TMO disposed between the bottom and top electrodes BEa and TEa. At least one electrical path EP may be generated in or disappear from the transition metal oxide pattern TMO by programming operation. Both ends of the electrical path EP may be connected to the bottom electrode BEa and the top electrode TEa, respectively. If the electrical path EP is generated in the transition metal oxide pattern TMO, the data storage part DSPc may have a low resistance value. If the electrical path EP is absent from the transition metal oxide pattern TMO, the data storage part DSPc may have a high resistance value. The data storage part DSPc may store the logic data using difference between the resistance values caused by the electrical path EP.

For example, the transition metal oxide pattern TMO may include at least one of niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, and barium-strontium-zirconium oxide. The bottom and top electrodes BEa and Tea may include at least one of a conductive metal nitride (e.g. titanium nitride, tantalum nitride, and/or tungsten nitride), a transition metal (e.g. titanium and/or tantalum), and a rare earth metal (e.g. ruthenium and/or platinum).

Next, a method of manufacturing a semiconductor memory device according to embodiments will be described with reference to drawings.

FIGS. 7A to 9A are plan views illustrating a method of manufacturing a semiconductor memory device according to example embodiments of the inventive concept. FIGS. 7B to 9B are cross-sectional views taken along lines I-I' and II-II' of FIGS. 7A to 9A, respectively. FIGS. 7C to 9C are cross-sectional views taken along lines III-III' of FIGS. 7A to 9A, respectively.

Figure 7A:
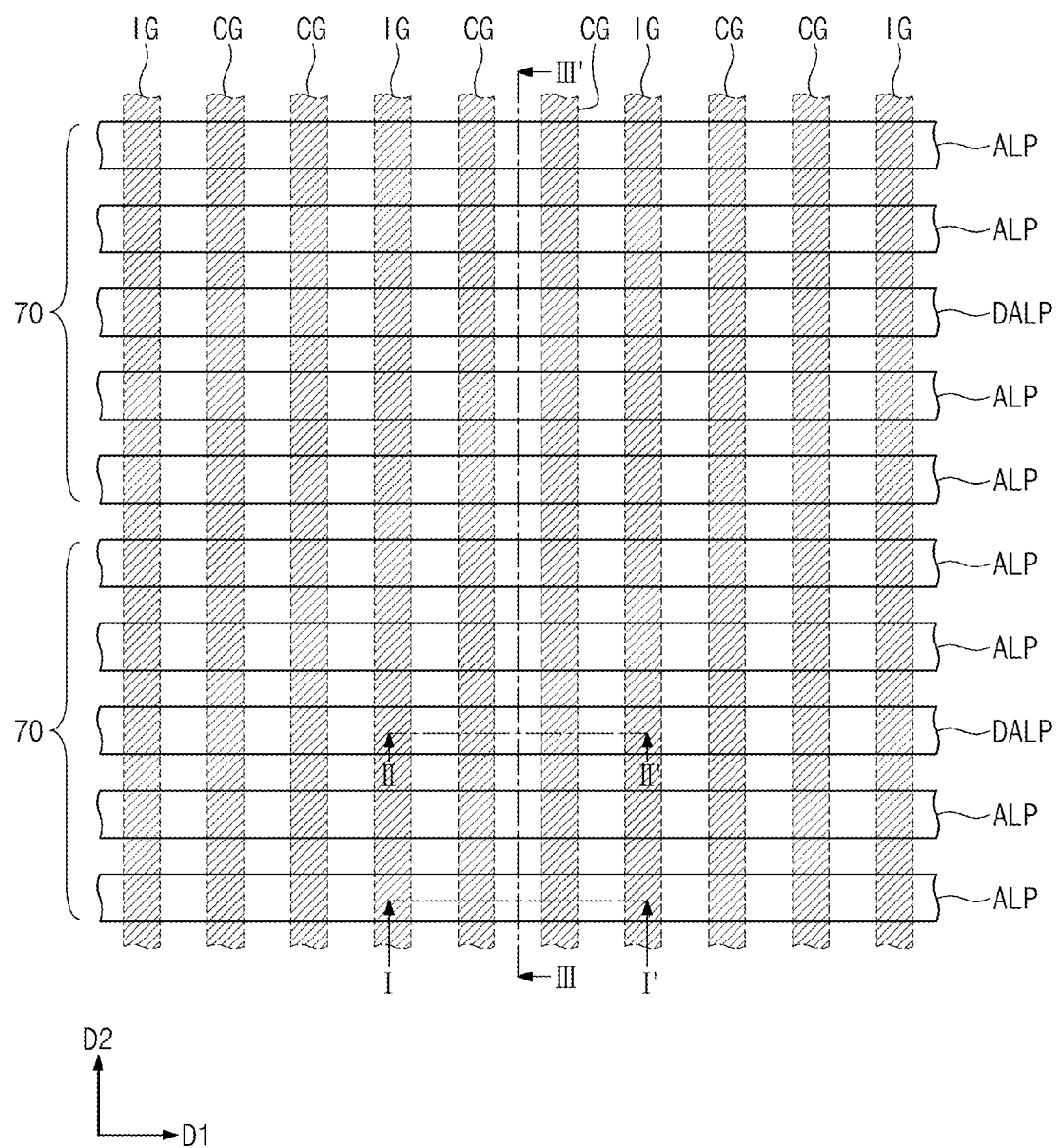
Figure 7B:
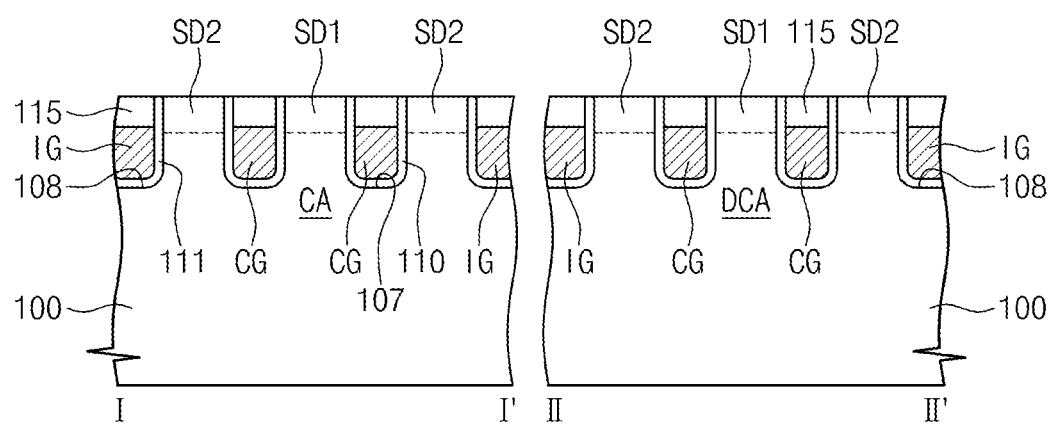
Figure 7C:
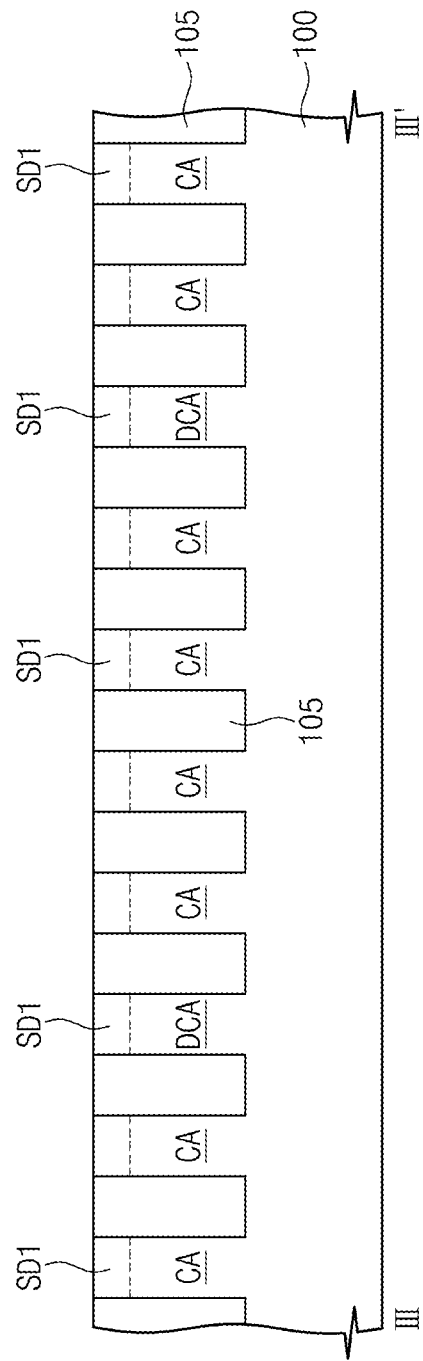

Referring to FIGS. 7A, 7B, and 7C, device isolation patterns 105 may be formed in or on a substrate 100 to define active line patterns ALP and DALP extending in parallel to each other in a first direction D1. The active line patterns ALP and DALP may be doped with dopants of a first conductivity type. The active line patterns ALP and DALP may be classified into a plurality of cell subgroups 70. The active line patterns ALP and DALP of each of the cell subgroups 70 may include a dummy active line pattern DALP and a plurality of cell active line patterns ALP.

The device isolation patterns 105 and the active line patterns ALP and DALP may be patterned to form isolation grooves 108 and cell grooves 107. Each of the cell active line patterns ALP may be divided into a plurality of cell active portions CA by the isolation grooves 108, and each of the dummy active line patterns DALP may be divided into a plurality of dummy active portions DCA by the isolation grooves 108. The cell grooves 107 may cross the active portions CA and DCA.

The isolation and cell grooves 108 and 107 may extend parallel to each other in a second direction D2 perpendicular to the first direction D1. A cell gate insulating layer 110 and an isolation gate insulating layer 111 may be formed in each of the cell grooves 107 and each of the isolation grooves 108, respectively. The cell and isolation gate insulating layers 110 and 111 may be formed at the same time.

Subsequently, a conductive layer may be formed to fill the cell and isolation grooves 107 and 108 on the substrate 100, and then the conductive layer may be planarized to form cell and isolation gate electrodes CG and IG in the cell and isolation grooves 107 and 108, respectively. Top surfaces of the cell and isolation gate electrodes may be recessed to be lower than top surfaces of the active portions CA and DCA. Next, a capping insulation layer may be formed to fill the cell and isolation grooves 107 and 108 on the gate electrodes CG and IG, and then the capping insulation layer may be planarized to form capping insulation patterns 115.

Dopants of a second conductivity type may be injected using the capping insulation patterns 115 as masks into the active portions CA and DCA, thereby forming first and second doped regions SD1 and SD2.

Figure 8A:
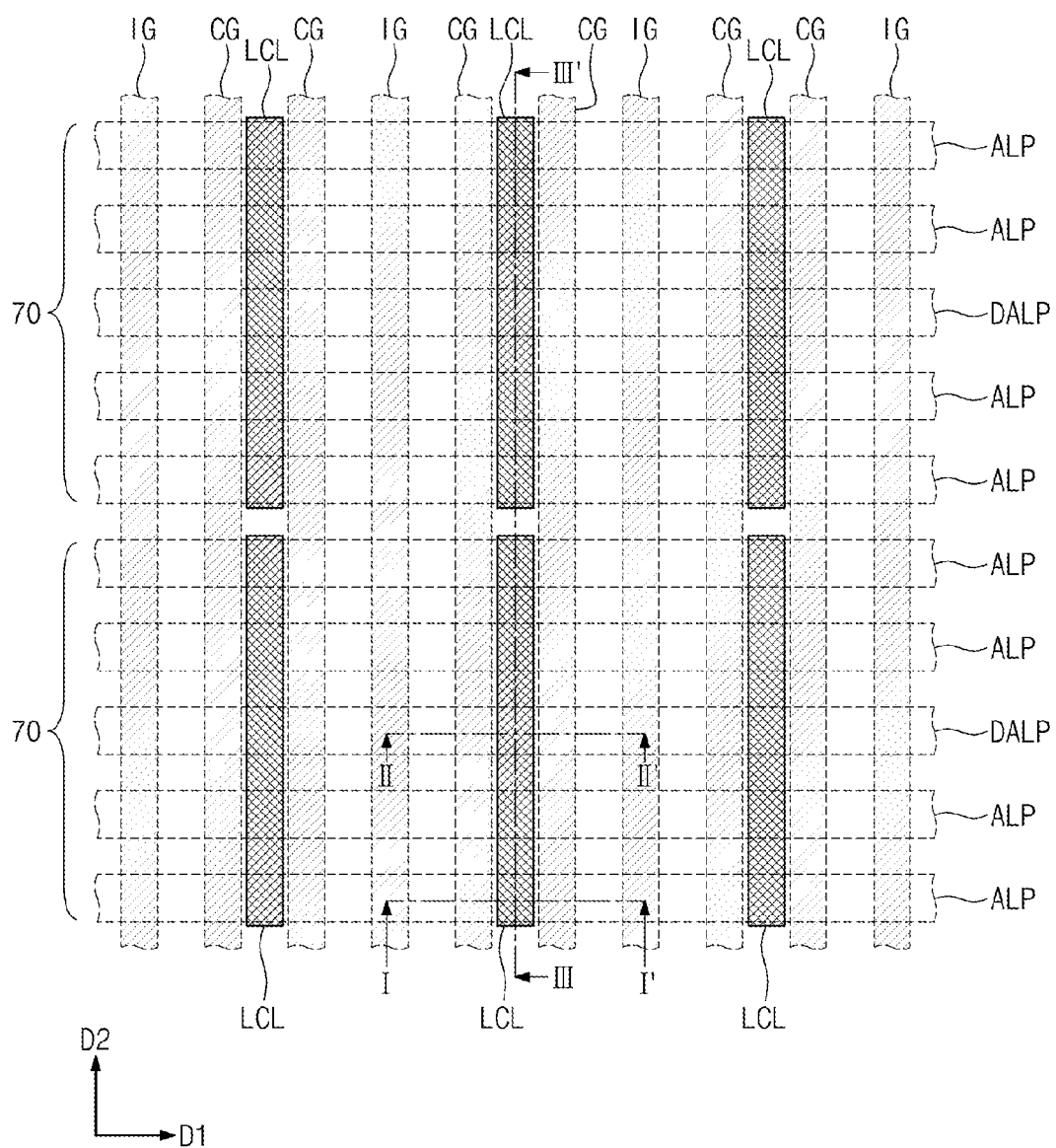
Figure 8B:
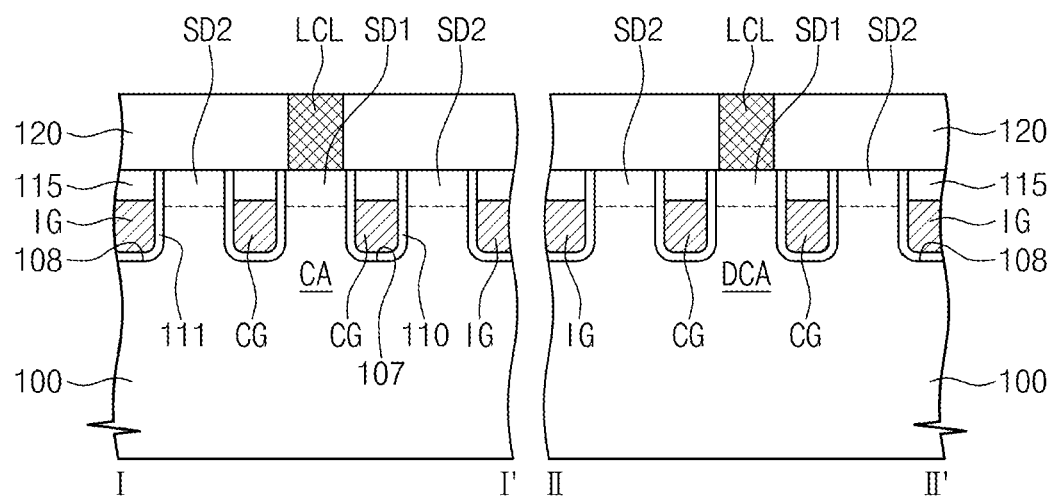
Figure 8C:
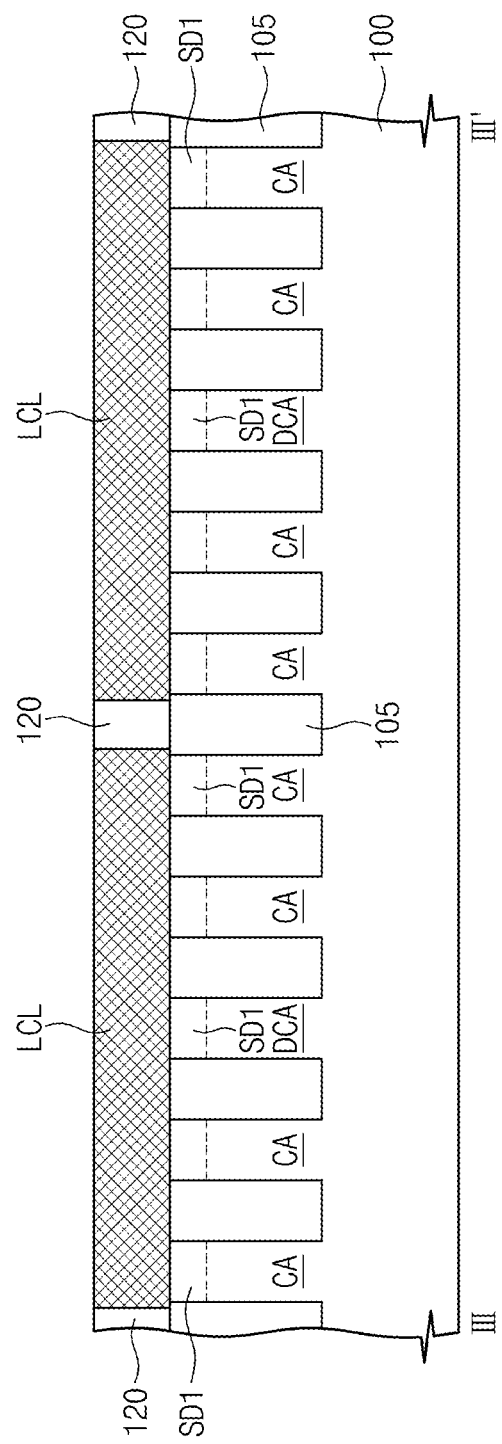

Referring to FIGS. 8A, 8B, and 8C, local interconnection lines LCL may be formed on the substrate 100. Each of the local interconnection lines LCL may be connected to the first doped regions SD1 arranged along the second direction D2 in each of the cell subgroups 70. A plurality of the local interconnection lines LCL may be formed in parallel to each other in each of the cell subgroups 70. The local interconnection lines LCL in one of the cell subgroups 70 are spaced apart from the local interconnection lines LCL in the others of the cell subgroups 70.

A first interlayer dielectric layer 120 may be formed on the substrate 100. In an example embodiment, the first interlayer dielectric layer 120 may be patterned to form local grooves, and then a conductive layer may be formed to fill the local grooves. The conductive layer may be planarized until the first interlayer dielectric layer 120 is exposed. Thus, the local interconnection lines LCL may be formed in the local grooves, respectively. In another example embodiment, a conductive layer may be formed on the substrate 100 and then the conductive layer may be patterned to form the local interconnection lines LCL. Thereafter, the first interlayer dielectric layer 120 may be formed on the substrate 100 having the local interconnection lines LCL, and then the first interlayer dielectric layer 120 may be planarized until the local interconnection lines LCL are exposed.

Figure 9A:
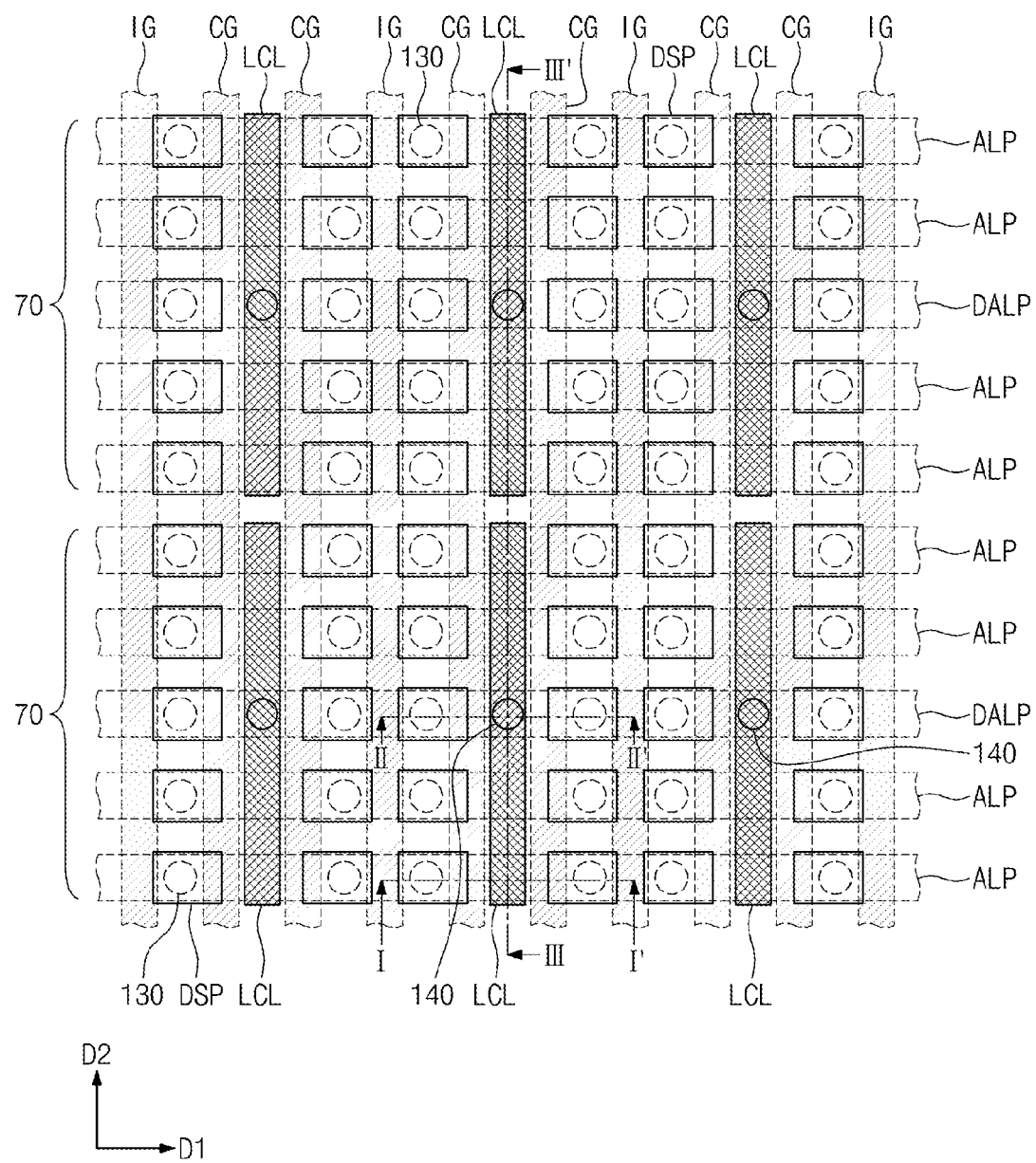
Figure 9B:
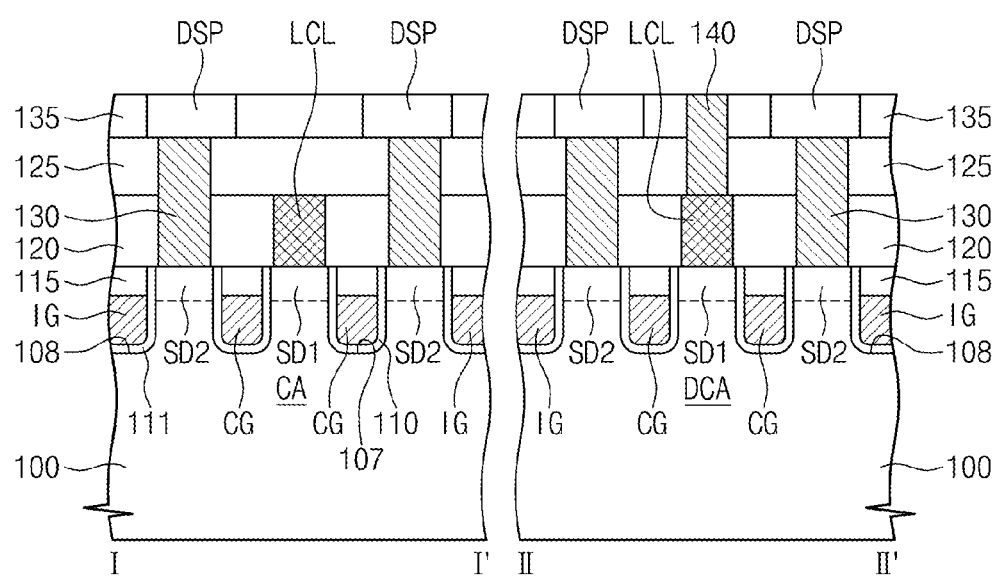
Figure 9C:
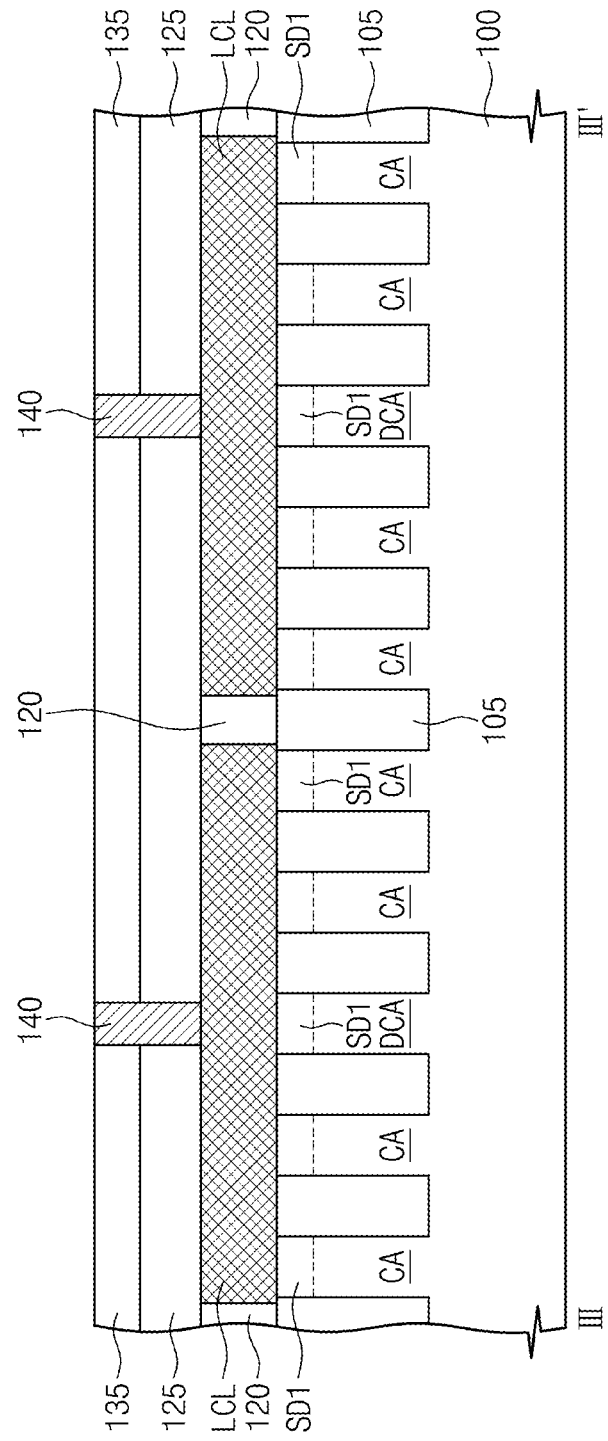

Referring to FIGS. 9A, 9B, and 9C, a second interlayer dielectric layer 125 may be formed on the first interlayer dielectric layer 120 and the local interconnection lines LCL. Contact plugs 130 may be formed to successively penetrate the second and first interlayer dielectric layers 125 and 120. The contact plugs 130 may be connected to the second doped regions SD2, respectively.

A plurality of data storage parts DSP may be formed on the second interlayer dielectric layer 125. The data storage parts DSP may be connected to top surfaces of the contact plugs 130, respectively. The data storage part DSP may be one of the data storage parts illustrated in FIGS. 6A to 6D.

A third interlayer dielectric layer 135 may be formed on the substrate 100. In an example embodiment, the third interlayer dielectric layer 135 may be planarized until top surfaces of the data storage parts DSP are exposed, as illustrated in FIGS. 9A to 9C. In another example embodiment, a top surface of the third interlayer dielectric layer 135 may be planarized, and the planarized third interlayer dielectric layer 135 may cover the top surfaces of the data storage parts DSP.

Subsequently, source plugs 140 may be formed to successively penetrate the third and second interlayer dielectric layers 135 and 125. Each of the source plugs 140 may be connected to each of the local interconnection lines LCL. The source plug 140 may be formed on a portion of the local interconnection line LCL which overlaps with the dummy active portion DCA. In more detail, the source plug 140 may be connected to the portion of the local interconnection line LCL which is connected to the first doped region SD1 of the dummy active portion DCA. In other words, the source plug 140 may overlap with the first doped region SD1 of the dummy active portion DCA.

Next, a conductive layer may be formed on the third interlayer dielectric layer 135, the data storage parts DSP, and the source plugs 140, and then the conductive layer may be patterned to form the bit and source lines BL and SL of FIG. 3A. Thus, the semiconductor memory device illustrated in FIGS. 3A, 3B, and 3C may be realized. In another example embodiment, the bit and source lines BL and SL and the cell and dummy active line patterns ALP and DALP may be formed as illustrated in FIG. 4. In still another example embodiment, the source plug 140 may be formed to have the same structure as the source plug 140a of FIGS. 5A and 5B.

The semiconductor memory devices according to the aforementioned example embodiments may be encapsulated using various packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above example embodiments is mounted may further include at least one semiconductor device (e.g., a controller and/or a logic device) that controls the semiconductor memory device.

Figure 10:
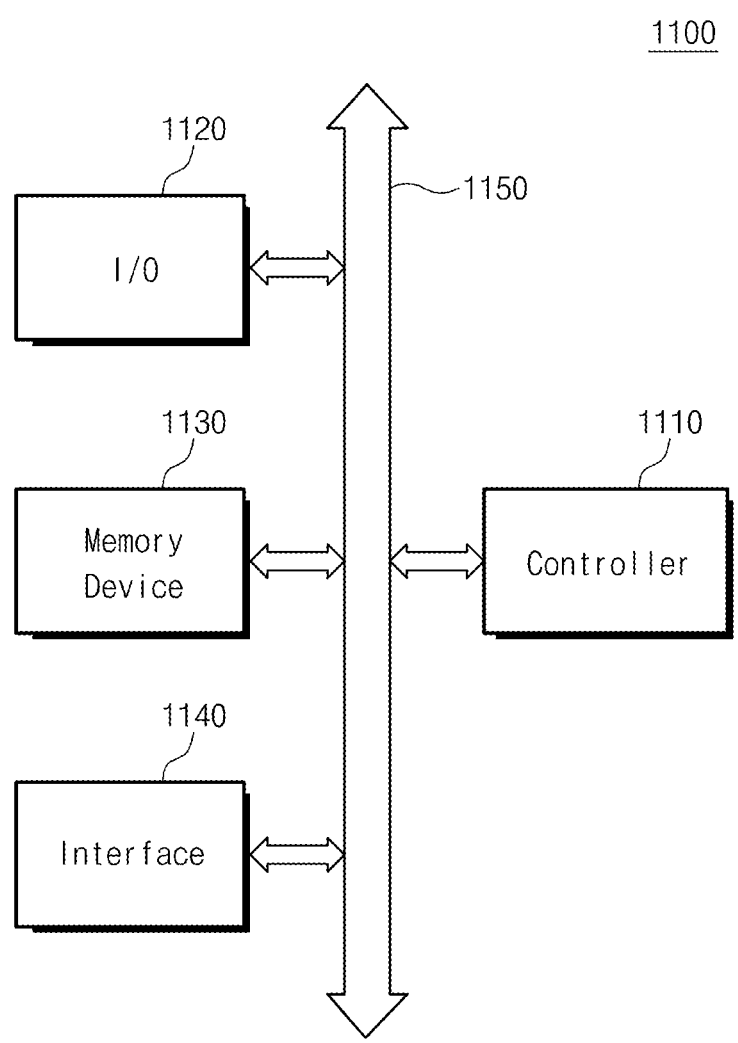

FIG. 10 is schematic block diagram illustrating an example of electronic systems including semiconductor memory devices according to example embodiments of the inventive concept.

Referring to FIG. 10, an electronic system 1100 according to an example embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor memory devices according to the example embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 11:
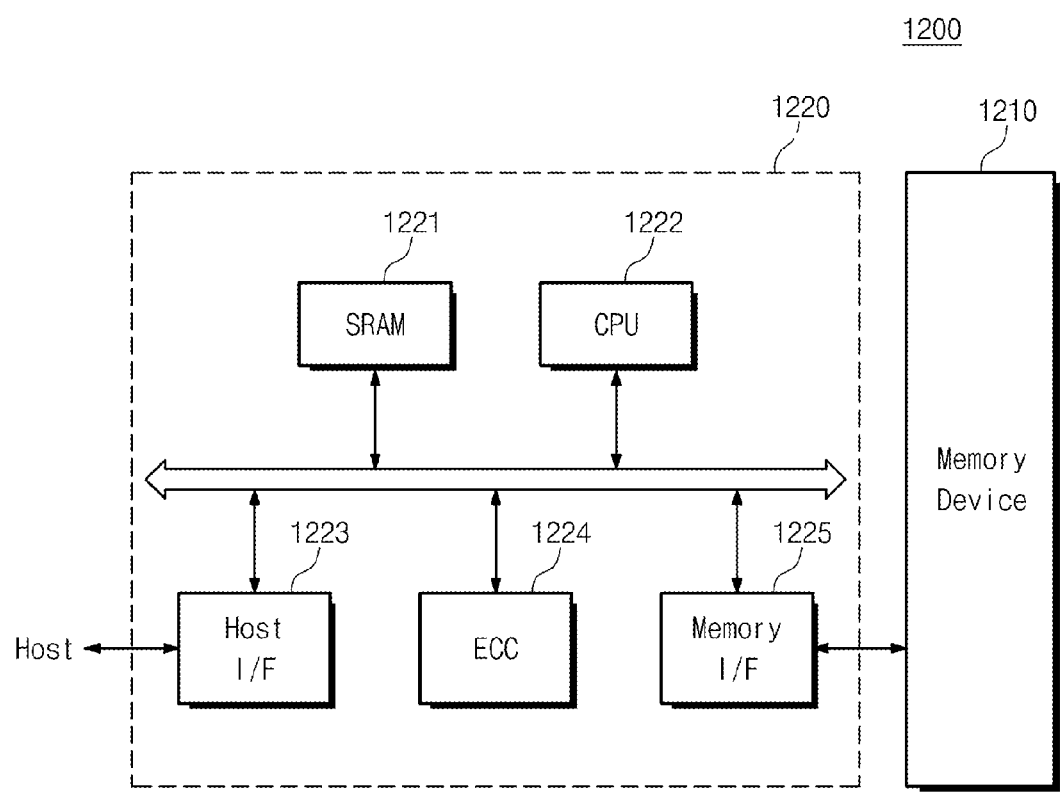

FIG. 11 is schematic block diagram illustrating an example of memory cards including semiconductor memory devices according to example embodiments of the inventive concept.

Referring to FIG. 11, a memory card 1200 according to an example embodiment may include a memory device 1210. The memory device 1210 may include at least one of the semiconductor memory devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

As described above, the unit cells in the cell array block may be classified into the plurality of cell subgroups, and the source line may be disposed in each of the cell subgroups. The source line is electrically connected to the source terminals of the unit cells of each of the cell subgroups. Thus, the source lines respectively included in the cell subgroups may be controlled independently from each other. As a result, the power consumption of the semiconductor memory device may be reduced, and the operating speed of the semiconductor memory device may be improved.

Additionally, the distance between the source line and the bit line adjacent thereto is equal to the distance between the bit lines adjacent to each other. In other words, the source and bit lines may be arranged at equal intervals. Thus, the highly integrated semiconductor memory device may be realized. Moreover, each of the cell subgroups includes a plurality of the bit lines. In other words, the plurality of bit lines may share the source line in each of the cell subgroups, such that the integration density of the semiconductor memory device may be more improved.

Furthermore, the source lines respectively included in the cell subgroups are controlled independently from each other. Thus, if the bad cell occurs, only the cell subgroup including the bad cell may be repaired with the redundancy cells. As a result, the area occupied by the redundancy cells may be reduced in the semiconductor memory device, such that the efficiency of the repairing process may be improved.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
   a plurality of unit cells two-dimensionally arranged along rows and columns in one cell array block, the unit cells classified into a plurality of cell subgroups, each of the cell subgroups including the unit cells constituting a plurality of the rows, and each of the unit cells including a selection element and a data storage part;
   a word line connected to gate electrodes of the selection elements of the unit cells constituting each of the columns;
   a plurality of bit lines connected to the data storage parts of the unit cells constituting the rows, the bit lines crossing the word line; and
   a source line in each of the cell subgroups, the source line being electrically connected to source terminals of the selection elements of the unit cells included in each of the cell subgroups, and the source line being adjacent to a select bit line of the bit lines,
   wherein the source line is parallel to the bit lines; and
   wherein a distance between the source line and the select bit line is equal to a distance between the bit lines adjacent to each other.

2. The semiconductor memory device of claim 1, wherein the source lines respectively included in the cell subgroups are controlled independently from each other.

3. The semiconductor memory device of claim 2, wherein the semiconductor memory device is configured to apply a reference voltage to the source line of a selected cell subgroup of the plurality of cell subgroups in an operation selected from a program operation and a sensing operation; and
   wherein the semiconductor memory device is configured to apply a voltage different from the reference voltage to, or to float, the source lines of unselected cell subgroups of the plurality of cell subgroups in the operation.

4. The semiconductor memory device of claim 1, further comprising:
   a plurality of local interconnection lines in each of the cell subgroups, the local interconnection lines extending parallel to each other in a longitudinal direction of the word line,
   wherein each of the local interconnection lines is connected to the source terminals of the unit cells arranged in a longitudinal direction of the word line;
   wherein the source line crosses and is connected to the local interconnection lines in each of the cell subgroups; and
   wherein the local interconnection lines in one of the cell subgroups are separated from the local interconnection lines in the others of the cell subgroups.

5. The semiconductor memory device of claim 4, wherein the unit cells constituting each of the columns are classified into a plurality of sub-columns that are included in the plurality of cell subgroups, respectively; and
   wherein the sub-columns are arranged in pairs, and
   the unit cells in each of the pairs of the sub-columns share one of the local interconnection lines in each of the cell subgroups and are symmetric with respect to the shared local interconnection line.

6. The semiconductor memory device of claim 1, further comprising:
   a dummy row in each of the cell subgroups, the dummy row including a plurality of dummy cells arranged in a direction parallel to the rows,
   wherein data storage parts of the dummy cells in the dummy row are connected to the source line.

7. The semiconductor memory device of claim 6, wherein the dummy row being adjacent to a select row from among the rows, and
   a distance between the dummy row and the select row is equal to a distance between the rows adjacent to each other.

8. The semiconductor memory device of claim 1, wherein the number of the bit lines included in each of the cell subgroups is at least four.

9. The semiconductor memory device 1, wherein the number of the bit lines at a side of the source line is equal to the number of the bit lines at another side of the source line in each of the cell subgroups.

10. A semiconductor memory device, comprising:
    a substrate including a plurality of active portions two-dimensionally arranged along rows and columns in one cell array block, the active portions being classified into a plurality of cell subgroups, and each of the cell subgroups including the active portions constituting a plurality of the rows;
    a pair of cell gate electrodes crossing the active portions constituting each of the columns, the pair of cell gate electrodes being insulated from the active portions;
    a first doped region in each of the active portions between the pair of cell gate electrodes;
    a pair of second doped regions each respectively in both edge portions of each of the active portions, the pair of cell gate electrodes being between the pair of second doped regions in a plan view;
    a plurality of data storage parts each respectively electrically connected to the pair of second doped regions; and
    conductive lines on the data storage parts, the conductive lines in each of the cell subgroups including a source line and a plurality of bit lines, the bit lines being electrically connected to the second doped regions of the active portions in each of the rows and the source line being electrically connected to the first doped regions in each of the cell subgroups, the conductive lines extending in parallel to each of the rows, wherein the active portions under the source line are dummy active portions, and a pair of dummy cells consists of the pair of cell gate electrodes and the first and second doped regions formed in each of the dummy active portions and the data storage parts connected thereto.

11. The semiconductor memory device of claim 10, wherein the source lines respectively included in the plurality of cell subgroups are controlled independently from each other.

12. The semiconductor memory device of claim 10, wherein the rows are arranged at equal intervals with respect to each other,
the conductive lines are arranged at equal intervals with respect to each other, and
the conductive lines are at the same level from a top surface of the substrate.

13. The semiconductor memory device of claim 10, further comprising:
a plurality of local interconnection lines on the substrate in each of the cell subgroups,
wherein each of the local interconnection lines is connected to the first doped regions in the active portions of each column within each cell subgroup;
wherein the source line crosses over the local interconnection lines and is electrically connected to the local interconnection lines in each of the cell subgroups; and
wherein the local interconnection lines in one of the cell subgroups are separated from the local interconnection lines in the others of the cell subgroups.

14. The semiconductor memory device of claim 13, further comprising:
a source plug between the source line and each of the local interconnection lines.

15. The semiconductor memory device of claim 14, wherein a width of a bottom surface of the source plug is smaller than a width of each of the local interconnection lines in a longitudinal direction of the source line.

16. The semiconductor memory device of claim 14, wherein a width of a bottom surface of the source plug is greater than a width of each of the local interconnection lines in a longitudinal direction of the source line.

17. The semiconductor memory device of claim 10, wherein the number of the bit lines in each of the cell subgroups is at least four.

18. The semiconductor memory device of claim 10, wherein the active portions under the bit line are cell active portions, and
wherein a pair of unit cells consists of the pair of cell gate electrodes and the first and second doped regions formed in each of the cell active portions and the data storage parts connected thereto.

19. The semiconductor memory device of claim 10, wherein the pair of cell gate electrodes are in cell grooves each respectively crossing the active portions of each of the columns.

20. The semiconductor memory device of claim 10, further comprising:
a plurality of device isolation patterns in or on the substrate in the one cell array block to define active line patterns extending parallel to each other in one direction; and
a plurality of isolation gate electrodes in isolation grooves crossing the active line patterns and the device isolation patterns parallel to each other, respectively, the isolation gate electrodes being insulated from the active line patterns,
wherein the isolation gate electrodes divide each of the active line patterns into the active portions constituting each of the rows.

21. A semiconductor memory device, comprising:
a substrate including a plurality of unit cells two-dimensionally arranged along rows extending in a first direction and columns extending in a second direction in one cell array block, the unit cells being classified into a plurality of cell subgroups, each of the cell subgroups including the unit cells constituting a plurality of the rows, and the unit cells including a plurality of gate electrodes and doped regions alternately arranged in the substrate along the first direction in each of the rows;
a plurality of data storage parts each respectively connected to a plurality of first-type doped regions from among the doped regions;
a plurality of conductive lines extending in the first direction, the plurality of conductive lines including first conductive lines and a second conductive lines, the second conductive lines being electrically connected to the first-type doped regions via the data storage parts, the second direction intersecting the first direction; and
a plurality of gate insulating layers each respectively insulating one of the gate electrodes from the doped regions,
wherein the gate insulating layers are conformally formed on the respective gate electrodes, the rows are arranged at equal intervals with respect to each other, and the conductive lines are arranged at equal intervals with respect to each other,
wherein, in each of the cell subgroups, the first conductive lines are electrically connected to second-type doped regions from among the doped regions, and
wherein the first conductive lines and the second conductive lines are at a same level from a top surface of the substrate.

22. The semiconductor memory device of claim 21, wherein the semiconductor memory device is configured to independently control the first conductive lines respectively included in the cell subgroups.

23. The semiconductor memory device of claim 21, wherein, in each of the cell subgroups, the second conductive lines are configured to be electrically isolated from the second-type doped regions.

24. The semiconductor memory device of claim 23, wherein the plurality of unit cells include at least two transistors,
each of the at least two transistors consists of one of the gate electrodes, one of the first-type doped regions, and one of the second-type doped regions, and
the at least two transistors share the one of the second-type doped regions.

25. The semiconductor memory device of claim 24, wherein the at least two transistors constituting each of the columns are selection elements of the unit cells.

26. The semiconductor memory device of claim 21, wherein the unit cells are a plurality of memory cells having a resistance changeable from a first resistance state to a second resistance state.

27. The semiconductor memory device of claim 21, further comprising:

a single local interconnection line, in each of the cell subgroups, via which the first conductive line is electrically connected to the second-type doped regions,
wherein the local interconnection line in one of the cell subgroups is electrically isolated from the local interconnection lines in the cell subgroups adjacent to the one of the cell subgroups.

28. The semiconductor memory device of claim 27, wherein the unit cells constituting a plurality of the rows in each of the cell subgroups share the first conductive line.

* * * * *